United States Patent
Shi et al.

(10) Patent No.: US 10,908,499 B2
(45) Date of Patent: Feb. 2, 2021

(54) TWO-DIMENSIONAL CONFORMAL OPTICALLY-FED PHASED ARRAY AND METHODS OF MANUFACTURING THE SAME

(71) Applicant: Phase Sensitive Innovations, Inc., Newark, DE (US)

(72) Inventors: Shouyuan Shi, Newark, DE (US); Dennis Prather, Newark, DE (US); Peng Yao, Newark, DE (US); Janusz Murakowski, Bear, DE (US)

(73) Assignee: Phase Sensitive Innovations, Inc., Newark, DE (US)

( * ) Notice: Subject to any disclaimer, the term of this patent is extended or adjusted under 35 U.S.C. 154(b) by 168 days.

(21) Appl. No.: 15/909,798

(22) Filed: Mar. 1, 2018

(65) Prior Publication Data

US 2018/0253002 A1 Sep. 6, 2018

Related U.S. Application Data

(60) Provisional application No. 62/465,181, filed on Mar. 1, 2017, provisional application No. 62/590,066, filed on Nov. 22, 2017.

(51) Int. Cl.
*G06F 7/00* (2006.01)
*G03F 7/00* (2006.01)
(Continued)

(52) U.S. Cl.
CPC ............. *G03F 7/0005* (2013.01); *G03F 7/16* (2013.01); *H01Q 3/2676* (2013.01);
(Continued)

(58) Field of Classification Search
CPC .. H01Q 3/2676; H01Q 21/062; H01Q 21/065; H01Q 1/2283; H01Q 1/38; G03F 7/16; G02B 6/12002
See application file for complete search history.

(56) References Cited

U.S. PATENT DOCUMENTS 7,671,799 B1    3/2010  Paek et al.
2002/0037137 A1  3/2002  Wu et al.
(Continued)

OTHER PUBLICATIONS

International Search Report and Written Opinion, issued from the International Searching Authority for International Application No. PCT/US2018/20518, dated Jun. 19, 2018 (15 pages total).

*Primary Examiner* — Stephen W Smoot
*Assistant Examiner* — Sun Mi Kim King
(74) *Attorney, Agent, or Firm* — Muir Patent Law, PLLC

(57) ABSTRACT

This disclosure is directed to two-dimensional conformal optically-fed phased arrays and methods for manufacturing the same. The method includes providing a wafer substrate, depositing a first cladding layer on the wafer substrate, and depositing a core layer on the first cladding layer. The method further includes photolithographically patterning the core layer to provide a plurality of optical waveguide cores, and depositing a second cladding layer on the core layer to cover the plurality of optical waveguide cores to provide a plurality of optical waveguides. In addition, the method includes forming a plurality of antennas on the second cladding layer, each antenna of the plurality of antennas located near a termination of a corresponding optical waveguide of the plurality of optical waveguides, and providing a plurality of photodiodes on the second cladding layer, each photodiode of the plurality of photodiodes connected to a corresponding antenna.

28 Claims, 25 Drawing Sheets

(51) Int. Cl.
*H01Q 21/06* (2006.01)
*G03F 7/16* (2006.01)
*H01Q 3/26* (2006.01)
*H01Q 1/38* (2006.01)
*H01Q 1/22* (2006.01)

(52) U.S. Cl.
CPC ......... *H01Q 21/062* (2013.01); *H01Q 21/065* (2013.01); *H01Q 1/2283* (2013.01); *H01Q 1/38* (2013.01)

(56) References Cited

U.S. PATENT DOCUMENTS

| | | |
|---|---|---|
| 2002/0061159 A1 | 5/2002 | Dahmani et al. |
| 2004/0156413 A1 | 8/2004 | Henrichs |
| 2010/0260462 A1 | 10/2010 | Zhang et al. |
| 2011/0150386 A1 | 6/2011 | Dupuis et al. |
| 2017/0054216 A1 | 2/2017 | Shi et al. |
| 2017/0294720 A1* | 10/2017 | Murakowski ............ H01Q 9/28 |

* cited by examiner

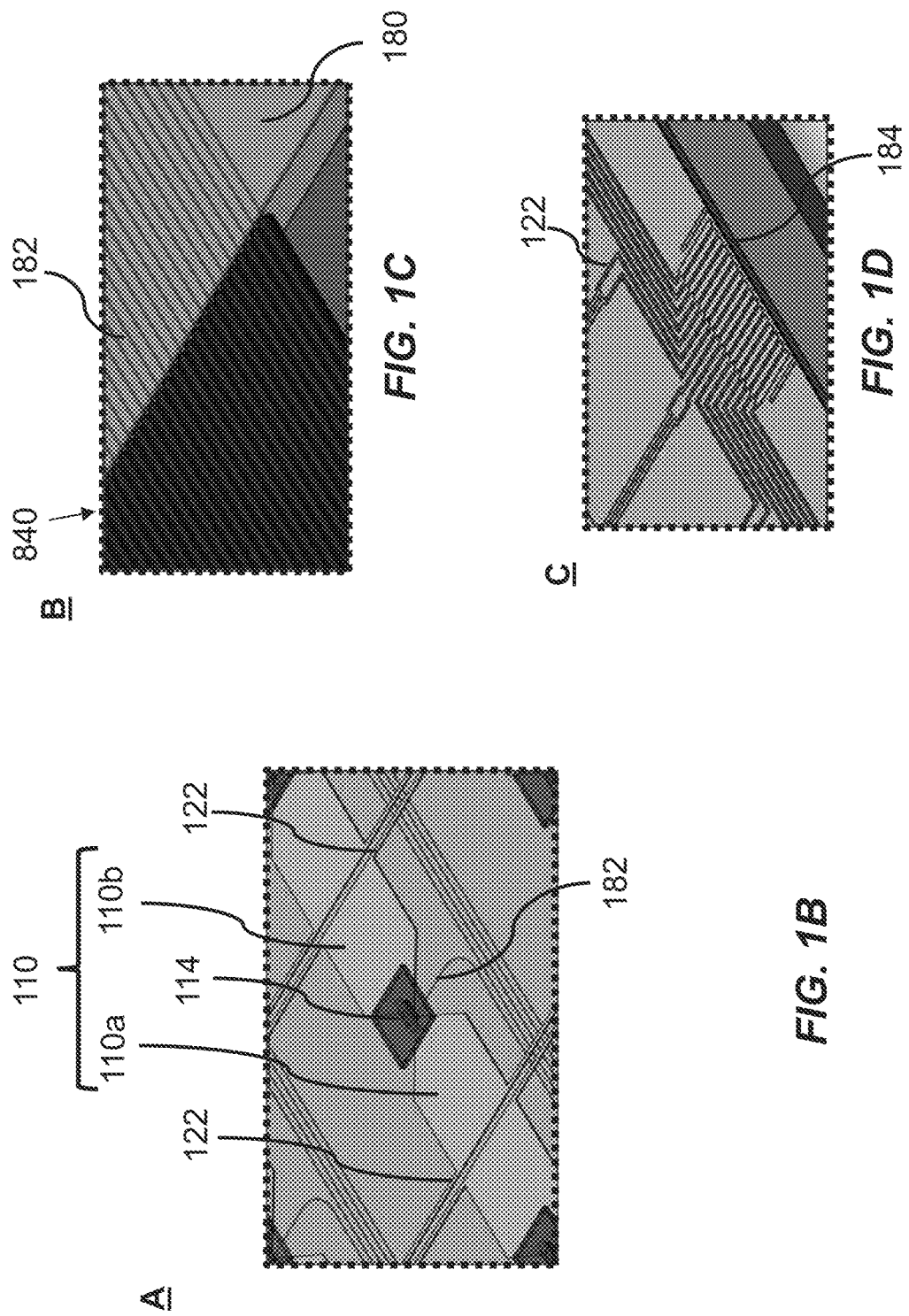

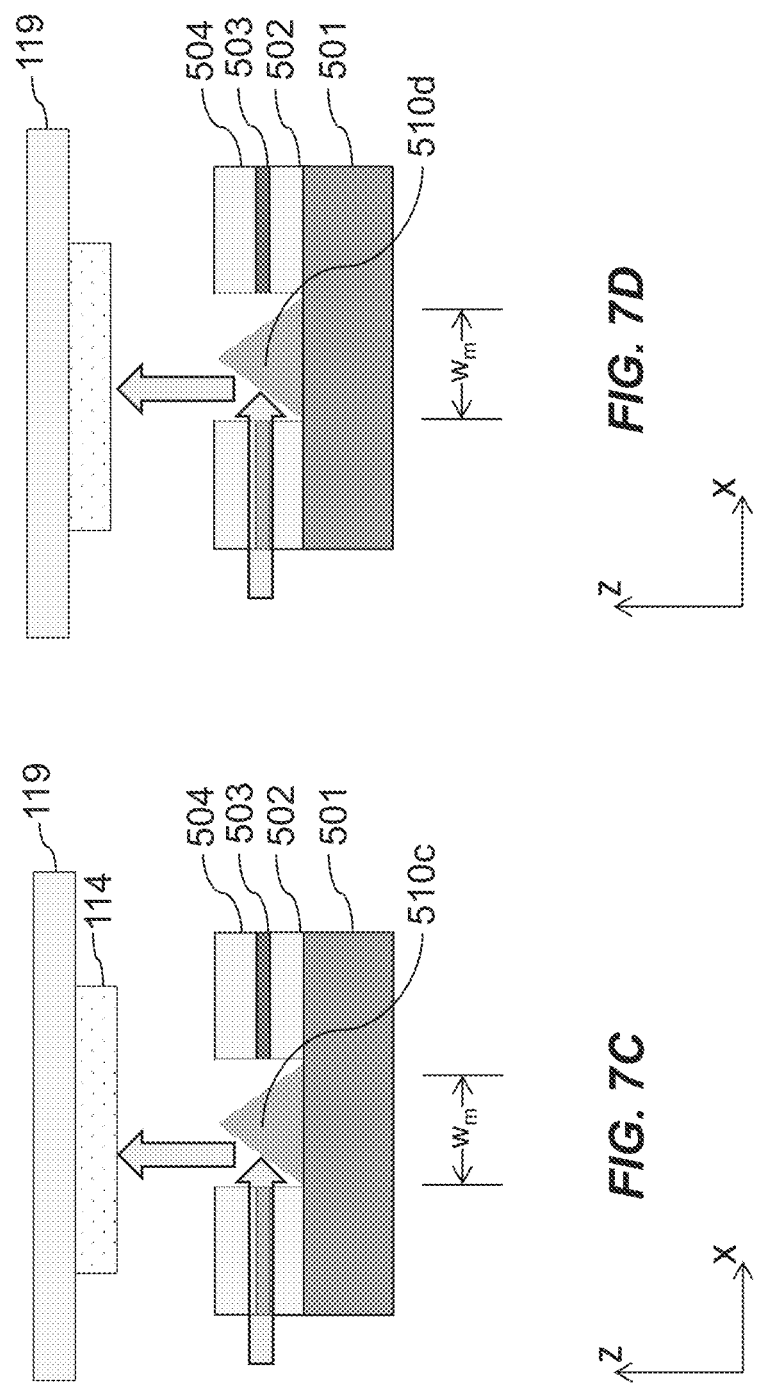

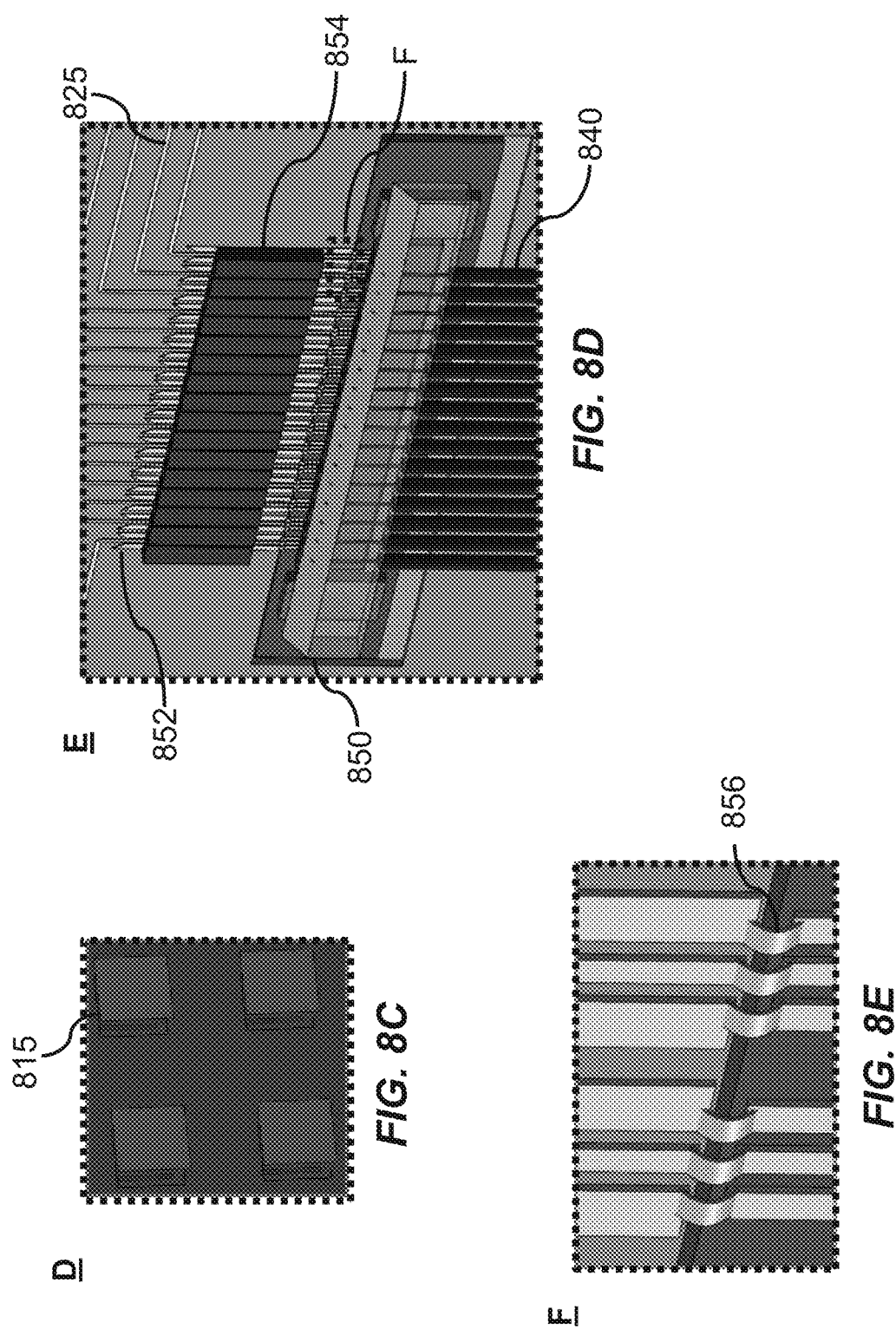

TWO-DIMENSIONAL CONFORMAL OPTICALLY-FED PHASED ARRAY AND METHODS OF MANUFACTURING THE SAME

CROSS-REFERENCES TO RELATED APPLICATIONS

This application claims the benefit of priority of U.S. Provisional Application No. 62/465,181, filed Mar. 1, 2017, and also claims the benefit of priority of U.S. Patent Application Ser. No. 62/590,066, filed Nov. 22, 2017, the entire contents of both of which are incorporated herein by reference.

GOVERNMENT SUPPORT

The subject matter herein disclosed was made with partial government funding and support under the Meta-program from Air Force Research Laboratory at Wright Paterson AFB under Contract No. FA8650-16-D-5851. The government has certain rights in this invention.

FIELD OF TECHNOLOGY

The herein described subject matter and associated exemplary implementations are directed to an optically fed antenna array and method of manufacture of an optically fed antenna array.

BACKGROUND

High density, high yield, and low-cost packaging of an array of high-speed high-power photodiodes are essential to the integration of large-scale optically driven phased arrays. In an application of 1D phased array, the off-the-shelf v-groove fiber array offers a great opportunity to realize an array of optical feeds to an array of photodiodes, thereby achieving simultaneous multi-channel RF generation with a single photodiode packaging process.

Conformal, low profile, and wideband phased arrays have received increasing attention due to their potential to provide multiple functionalities over several octaves of frequency, using shared common apertures for various applications, such as radar, ultra-fast data-links, communications, RF sensing, and imaging. These arrays offer tremendous advantages, including multiple independently steerable beams, polarization flexibility, and high reliability.

With high frequency operation, high input resistance in transmitting the RF signal driving to the antenna may cause an imbalanced operation of the radiating elements of the antenna. Conventional 50-$\Omega$ coaxial line feeding the RF signal to the antenna is often unsuited for a balanced operation of the antenna. As a result, a balanced-to-unbalanced transformer, i.e., a balun, as well as an impedance transformer, is typically provided for each radiating element. The use of these transformers, however, can impose additional restrictions on the performance of the antenna array, such as the bandwidth, operational frequency, weight and profile, particularly at high operational frequencies, conformability, overall compactness and the additional relative high costs of these components.

Use of certain structure associated with conventional antenna arrays (such as baluns, amplifiers and/or RF transmission lines) may be reduced or avoided altogether by optically feeding the RF information to the antenna array, such as with optical fibers. For example, in an optically-fed phased-array architecture, transmitting signals are converted from the electrical domain to the optical domain by using electro-optic (EO) modulators, transmitted to the antenna array via optical fibers. Each optical fiber outputs its optical signal to a photodiode/antenna pair, where the photodiode receives the optical signal output from the optical fiber and outputs an electrical signal to drive the antenna to which it is connected. Such antenna arrays can have low impact in the physical space they occupy, and may be implemented with a low height profile and may be formed conformally to non-planar surfaces. However, complexities in installation of the antenna array may make it difficult to easily take advantage of the small form factor and conformal configurations available for such optically fed antenna arrays.

SUMMARY

In some embodiments, the disclosure is directed to a method of manufacturing an optical waveguide module, comprising: providing a wafer substrate; depositing a first cladding layer on the wafer substrate; depositing a core layer on the first cladding layer; photolithographically patterning the core layer to provide a plurality of optical waveguide cores; depositing a second cladding layer on the core layer to cover the plurality of optical waveguide cores to provide a plurality of optical waveguides; forming a plurality of antennas on the second cladding layer, each antenna of the plurality of antennas located near a termination of a corresponding optical waveguide of the plurality of optical waveguides; and providing a plurality of photodiodes on the second cladding layer, each photodiode of the plurality of photodiodes connected to a corresponding antenna.

In some aspects, the method further includes integrating an input fiber array with the plurality of optical waveguides.

In some aspects, the method further includes wherein the wafer substrate is a quartz substrate.

In some aspects, the method further includes wherein the first cladding layer includes a silicon oxide.

In some aspects, the method further includes wherein the first cladding layer has a thickness less than 5 µm.

In some aspects, the method further includes wherein the core layer includes a silicon nitride.

In some aspects, the method further includes wherein the core layer has a less than 0.4 µm.

In some aspects, the method further includes wherein the second cladding layer includes a silicon oxide.

In some aspects, the method further includes wherein the second cladding layer has a thickness of less than 6 µm.

In some aspects, the method further includes wherein the photolithographically patterning the core layer further includes providing a plurality of grating couplings, wherein each of the plurality of grating couplings is provided at a location corresponding to a corresponding one of the plurality of photodiodes.

In some aspects, the method further includes patterning a plurality of openings in a stack consisting of the first cladding layer, the core layer, and the second cladding layer to provide an opening; and providing a micro-bend in each of the plurality of openings, wherein each of the plurality of openings is provided at a location corresponding to one of the plurality of photodiodes.

In some aspects, the method further includes wherein the micro-bend is a microprism.

In some aspects, the method further includes wherein the micro-bend is a photoresist mirror.

In some aspects, the method further includes wherein the micro-bend is wet-etch silicon Si mirror.

In some aspects, the method further includes wherein the micro-bend is an epitaxially-grown microprism.

In some embodiments, the disclosure is directed to an antenna array system, comprising: a wafer substrate; a plurality of layers formed on the wafer substrate, the plurality of layers including a first cladding layer, a core layer, and a second cladding layer; a plurality of dipole antennas mounted on the plurality of layers and configured to operate as an antenna array, each dipole antenna having first and second radiating arms extending in a first direction and having a length L in the first direction; a plurality of photodiodes mounted on the plurality of layers, each photodiode configured to generate an RF current to drive a corresponding dipole antenna to which the photodiode is connected; and a plurality of micro-bends formed in the plurality of layers and aligned with a corresponding one of the plurality of photodiodes, each micro-bend configured to receive an optical signal from an associated optical waveguide among a plurality of optical waveguides and redirect the optical signal to the corresponding one of the plurality of photodiodes above the plurality of layers.

In some aspects, the system further includes wherein each photodiode has an anode electrically connected to the first radiating arm of a corresponding dipole antenna with a first conductor, and a cathode electrically connected to the second radiating arm of the corresponding dipole antenna with a second conductor.

In some aspects, the system further includes wherein an extending length of the first conductor as measured from a first connection point of the first conductor to the anode to a second connection point of the first conductor to the first radiating arm is less than the length L of the dipole antennas, and wherein an extending length of the second conductor electrically as measured from a first connection point of the second conductor to the cathode to a second connection point of the second conductor to the second radiating arm is less than the length L of the dipole antennas.

In some aspects, the system further includes wherein the extending lengths of the first and second conductors are less than or equal to L/2.

In some aspects, the system further includes wherein the plurality of optical waveguides are optical fibers.

In some aspects, the system further includes wherein adjacent radiating arms of adjacent first and second dipole antennas are electrically connected to each other.

In some aspects, the system further includes wherein adjacent radiating arms of adjacent dipole antennas are electrically coupled to each other by a capacitor.

In some aspects, the system further includes wherein said dipole antennas are mounted on a first surface of the wafer substrate, and the photodiodes are mounted on a second surface, opposite to the first surface, of the wafer substrate.

In some aspects, the system further includes wherein the plurality of micro-bends include grating couplers.

In some aspects, the system further includes wherein the plurality of micro-bends comprise microprisms.

In some aspects, the system further includes wherein the plurality of include photoresist mirrors.

In some aspects, the system further includes wherein the plurality of micro-bends include wet-etch silicon Si mirrors.

In some aspects, the system further includes wherein the plurality of micro-bends include epitaxially-grown microprisms.

In some embodiments, the disclosure is directed to a method of manufacturing a radio frequency (RF) antenna module, comprising: providing a first antenna substrate, a second antenna substrate, and a ground plane including a plurality of apertures; patterning a patch antenna array on the first antenna substrate, the patch antenna array including a plurality of aperture-coupled patch antennas regularly arranged in a first direction and a second direction perpendicular to the first direction; patterning a plurality of microstrip lines on the second antenna substrate; interposing the ground plane between the first antenna substrate and the second antenna substrate; and providing an input array module including an optical connector to connect to a optical fiber array to receive input optical signals from an optical fiber array, the input array module configured to convert the received input optical signals to RF signals, and output the RF signals, wherein ground plane includes a plurality of slots regularly arranged in the first direction and the second direction, each slot aligned with a corresponding aperture-coupled patch antenna of the plurality of aperture-coupled patch antennas, and wherein each of the plurality of microstrip lines extends from the input array module to a corresponding one of the plurality of slots, each microstrip line configured to receive the RF signals output by the input array module and transmit the RF signals to a corresponding patch antenna through a corresponding slot in the ground plane.

In some aspects, the method further includes wherein the input array module includes a plurality of coplanar waveguides, the method further comprising: connecting the plurality of coplanar waveguides with the plurality of microstrip lines.

In some aspects, the method further includes wherein the input array module includes a v-groove assembly.

In some embodiments, the disclosure is directed to an antenna array system, comprising: a first antenna substrate including a plurality of patch antennas regularly arranged in a first direction and a second direction perpendicular to the first direction; a second antenna substrate including a plurality of microstrip transmission lines; a ground plane interposed between the first antenna substrate and the second antenna substrate and including a plurality of slots regularly arranged in the first direction and the second direction, each slot of the plurality of slots aligned with a corresponding patch antenna of the plurality of patch antennas; an input array module including an optical connector to connect to a optical fiber array to receive optical signals from the optical fiber array, the input array module configured to convert the optical signals to RF signals, and output the RF signals; and wherein each of the plurality of microstrip transmission lines extends from the input array module to a corresponding one of the plurality of slots, each microstrip transmission line configured to receive the RF signal output by the input array module and transmit the RF signal to a corresponding patch antenna through a corresponding slot in the ground plane.

In some aspects, the system further includes wherein the input array module includes a v-groove assembly.

In some aspects, the system further includes wherein the input array module comprises: a plurality of photodiodes mounted on a first module substrate, each photodiode aligned with a corresponding optical fiber of the optical fiber array; and a plurality of RF electrodes mounted on a second module substrate and flip-chip bonded to the plurality of photodiodes.

In some aspects, the system further includes wherein each optical fiber of the optical fiber array is attached to a corresponding reflector so that an optical axis of the optical fiber is substantially parallel to at least one of inner surfaces or outer surfaces of the first module substrate.

In some aspects, the system further includes wherein the corresponding reflector is attached to an outer surface of the first module substrate, and wherein the corresponding reflector is configured to reflect an optical signal provided by a corresponding connected optical fiber through a corresponding hole in the first module substrate to impinge the corresponding photodiode.

In some embodiments, the disclosure is directed to a method of manufacturing an optical waveguide module, comprising: providing a wafer substrate; depositing a first cladding layer on the wafer substrate; depositing a core layer on the first cladding layer; depositing a second cladding layer on the core layer; patterning a plurality of openings in a stack consisting of the first cladding layer, the core layer, and the second cladding layer; providing a plurality of micro-bends, each micro-bend provided in a corresponding one of the plurality of openings; forming a plurality of antennas on the second cladding layer, each antenna of the plurality of antennas located near a corresponding one of the plurality of micro-bends; and providing a plurality of photodiodes on the second cladding layer, each photodiode of the plurality of photodiodes connected to a corresponding antenna and located above the corresponding micro-bend.

In some aspects, the method further includes photolithographically patterning the core layer to provide a plurality of optical waveguides.

In some aspects, the method further includes integrating an input fiber array with the plurality of optical waveguides.

In some aspects, the method further includes wherein the plurality of micro-bends include wet-etch silicon Si mirrors.

In some aspects, the method further includes wherein the wafer substrate is a quartz substrate.

In some aspects, the method further includes wherein the first cladding layer includes a silicon oxide.

In some aspects, the method further includes wherein the first cladding layer has a thickness less than 5 µm.

In some aspects, the method further includes wherein the core layer includes a silicon nitride.

In some aspects, the method further includes wherein the core layer has a thickness less than 0.4 µm.

In some aspects, the method further includes wherein the second cladding layer includes a silicon oxide.

In some aspects, the method further includes wherein the second cladding layer has a thickness less than 6 µm.

BRIEF DESCRIPTION OF DRAWINGS

FIG. 1B is an enlargement of section A of FIG. 1A, FIG. 1C is an enlargement of section B of FIG. 1A, and FIG. 1D is an enlargement of section D of FIG. 1A.

FIGS. 7A-7E are diagrams illustrating micro-bends, according to certain exemplary embodiments FIG. 8C is an enlargement of section D of FIG. 8A, FIG. 8D is an enlargement of section E of FIG. 8B, and FIG. 8E is an enlargement of section F of FIG. 8D.

DETAILED DESCRIPTION

Figure 1A:
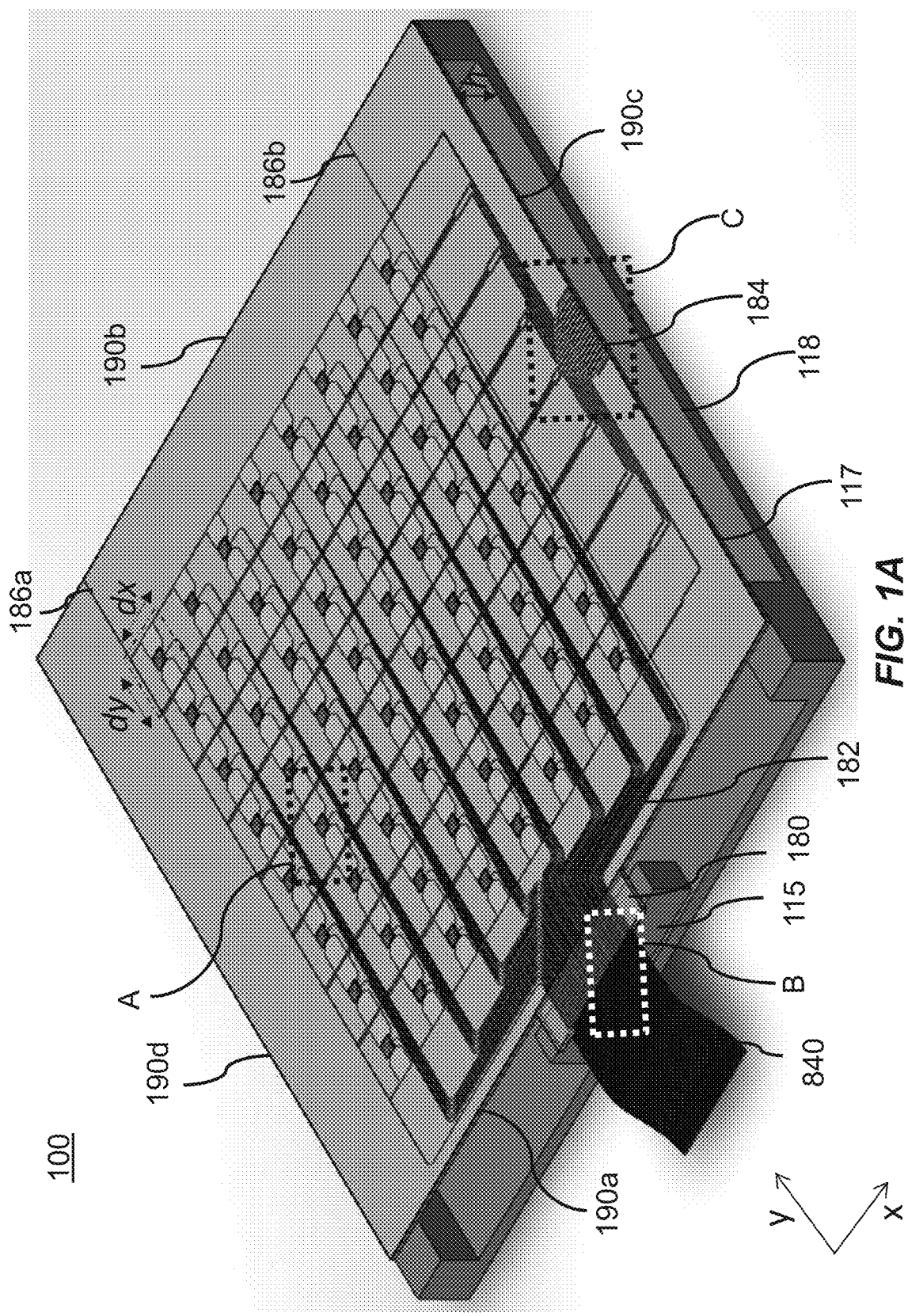
FIG. 1A is a diagram of an optically-distributed feed module with optical waveguides formed in the substrate, according to certain exemplary embodiments.

The present disclosure now will be described more fully hereinafter with reference to the accompanying drawings, in which various exemplary implementations are shown. The invention may, however, be embodied in many different forms and should not be construed as limited to the example exemplary implementations set forth herein. These example exemplary implementations are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Although the figures described herein may be referred to using language such as "one exemplary implementations," or "certain exemplary implementations," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary implementation.

The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that the terms "comprise" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between"). Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1E:
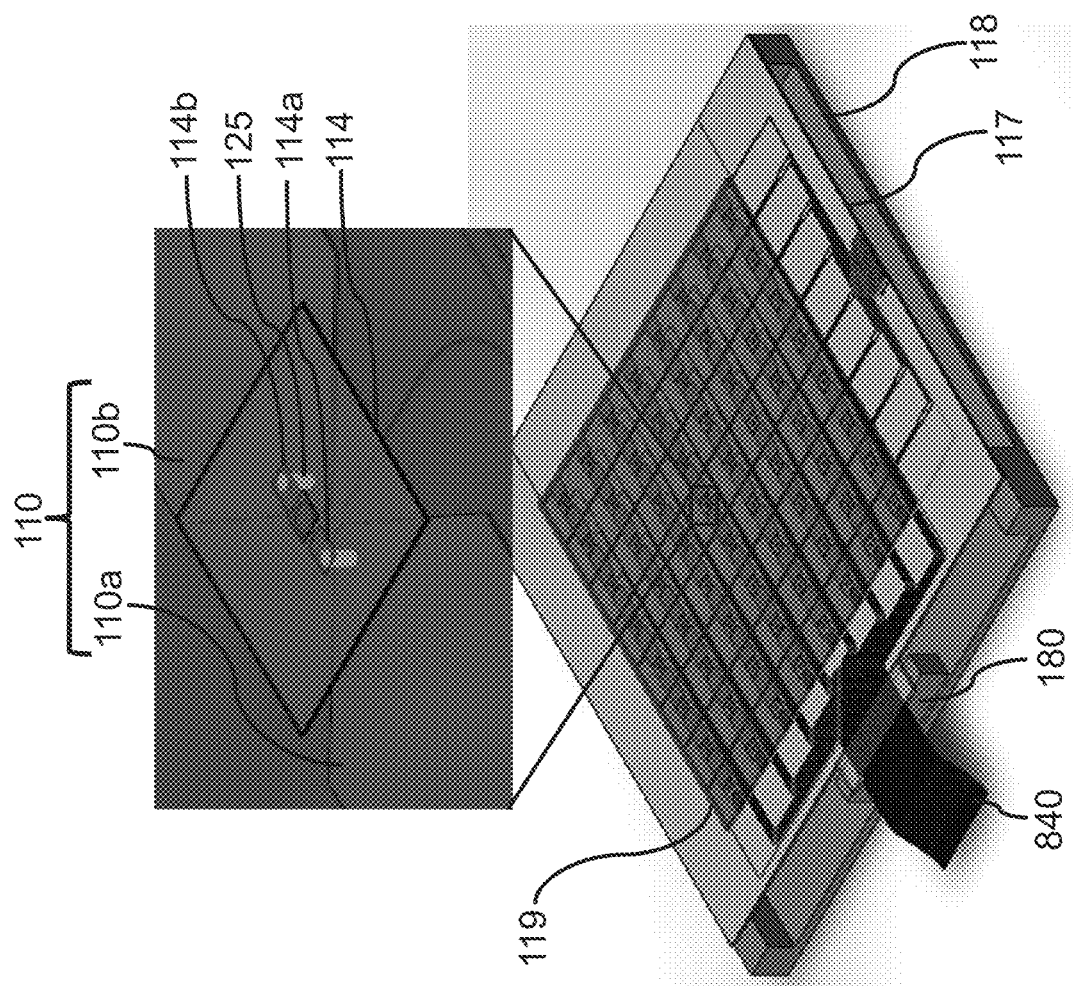
FIG. 1E is a diagram of an optically-distributed feed module with optical waveguides formed in the substrate, according to certain exemplary embodiments.

FIGS. 1A through 1E illustrate an example of an antenna array module 100 including a signal feed module 117 providing signal feeds from optical fibers 840 to an array of antennas 110. In this example, the signal feed module 117 forms optical waveguides 182 that may transmit optical signals across signal feed module 117. The optical signals are converted to an RF signal at a photodiode/antenna pair on the optically-distributed signal feed module 117. FIG. 1A is a perspective view of an antenna array module 100 including an optically-distributed signal feed module 117 with optical waveguides formed therein, according to certain exemplary embodiments. FIG. 1B is an enlargement of section A of FIG. 1A, FIG. 1C is an enlargement of section B of FIG. 1A, and FIG. 1D is an enlargement of section D of FIG. 1A. FIG. 1E is a perspective view of an antenna array module 100 including an optically-distributed signal feed module 117 having front-illuminated photodiodes, according to certain exemplary embodiments.

In FIGS. 1A-1E, antenna array module 100 comprises an optically-distributed signal feed module 117 mounted on a ground plane 118. In this example, an array of antennas 110 is formed on and as part of signal feed module 117. The antennas 110 in this example are dipole antennas, each with two radiating arms 110a, 110b, that collectively form antenna array module 100 as a phased array antenna. A plurality of unit cells 100a of the antenna array module 100 are regularly arranged in the x- and y-directions. Thus, each unit cell 100a of the antenna array module 100 of may comprise a dipole antenna 110 having two conductive radiating arms 110a and 110b and a photodiode 114 electrically connected to radiating arms 110a and 110b to act as a driving source for the dipole antenna 110 of the unit cell 100a. The unit cells 100a (and thus the structure of the unit cells 100a, including the dipole antennas 110 and photodiodes 114) are arranged on the signal feed module 117 with a pitch of dx along the x-axis and a pitch of dy along the y-axis.

In this example, the dipole antennas 110 are arranged on an upper surface of the signal feed module 117. The lower surface of the signal feed module faces an upper surface of ground plane 118. Photodiodes 114 may be mounted on the upper surface of the signal feed module 117, such as by flip-chip bonding the photodiodes 114 to a conductive metal pattern formed on the upper surface of the signal feed module 117 to thereby connect anode 114a and cathode 114b electrodes of each of the photodiodes 114 to a corresponding antenna 110. Photodiodes 114 may be connected to antennas 110 in other ways and need not be mounted to the signal feed module 117 as in FIG. 1A. In this example, for each pair of a dipole antenna 110 and photodiode 114 of a unit cell 100a, an anode 114a of the photodiode 114 is electrically connected to one of the radiating arms 110a and a cathode 114b of the photodiode 114 may be electrically connected to another of the radiating arms 110b. The radiating arms 110a and 110b of the dipole antenna 110 may extend away lengthwise in the y-direction from the photodiode 114 to which they are connected. Dipole antennas 110 may be aligned on the upper surface of the signal feed module 117 in rows extending in the y-direction, and radiating arms 110a, 110b of neighboring dipole antennas 110 in the y-direction may be electrically connected via a capacitor (not illustrated).

The substrate of the optically-distributed signal feed module 117 may a crystalline wafer, such as a quartz wafer or a crystalline semiconductor wafer such as a silicon wafer, silicon on insulator wafer, etc. The entire signal feed module 117 may comprise one layer or a stack of layers, where each layer is continuous and formed of the same material. However, it also possible that signal feed module 117 is formed with several interconnected discrete substrates. Signal feed module 117 may be a sheet formed as a single printed circuit board or a group of interconnected circuit boards. The signal feed module 117 may comprise a stack of insulating layers (e.g., SiO$_2$, polyimide) that insulate wiring disposed on or between the insulating layers, such that the wiring provides electrical connections (discussed herein) to the dipole antennas 110. The signal feed module 117 may be flexible in order to conform to curved surfaces on which it may be mounted (e.g., on the curved hull of an aircraft). Thus, signal feed module 117 need not be planar as shown in FIG. 1A, and instead may comprise curved surfaces, such as a concave and/or convex surface. For example, the signal feed module 117 may comprise or be formed to conform to a spherical surface or conform to a curved surface (e.g., body or wing) of a vehicle, such as, for example, an aircraft. It will be appreciated that the positioning of the dipole antennas 110 are dependent on their placement on signal feed module 117 in this example, and thus may also have a non-planar configuration and may be the same non-planar configuration as described herein with respect to the signal feed module 117. The radiating arms 110a and 110b of the dipole antennas 110 may also be non-planar and have a curved shape to conform to a curved surface of the signal feed module 117 on which they are formed. For ease of description, the signal feed module 117 is illustrated as having a square or rectangular shape with four linear edges 190a, 190b, 190c, and 190d. However, the signal feed module 117 may have other shapes.

Ground plane 118 may comprise a sheet of metal spaced a constant spacing distance h away from the dipole antennas 110. The spacing distance h may be about the distance of a quarter wavelength of the intermediate frequency of the operational frequency range. For example, in an embodiment where the operational frequency is 4-15 GHz, spacing distance h may be about 6.5 mm+/−10%. However, other frequency ranges may allow for a different spacing distance h, such as less than 5 mm or less, or such as between 10 mm and 50 mm, or greater. Although ground plane 118 is shown as a rectangular planar sheet, ground plane 118 may also have other geometries, including the non-planar structure as described with respect to signal feed module 117 to conform to a non-planar positioning of the dipole antennas 110. While FIG. 1A has been shown to include a ground plane 118, other exemplary implementations may be formed and operate without the provision of a ground plane.

An optical connector 180 may be arranged at a first edge 190a of the signal feed module 117. In the example of FIG. 1A, the optical connector 180 is mounted on a projection 115 on and integrally formed with ground plane 118. However, the optical connector 180 may be positioned elsewhere, such as on the upper or lower surface of signal feed module 117, or may be integrally formed as part of the signal feed module 117. The optical connector 180 may connect a plurality of optical waveguides 182 formed by signal feed module 117 with a plurality of optical fibers 840.

In the embodiment of FIG. 1A, the optical waveguides 182 may extend horizontally in a direction parallel to the upper surface of the substrate of the signal feed module 117, which may also be parallel to the upper and lower surfaces of the signal feed module 117 and ground plane 118. As illustrated in FIGS. 1A and 1B, each optical waveguide 182 may horizontally extend and terminate at a location of a corresponding individual unit cell 100a. At the unit cell 100a, the optical waveguide 182 may terminate at a reflective surface (e.g., a surface of a micro-bend 505 as discussed elsewhere herein) such that the optical path vertically extends near the end of the optical waveguide 182 in the vertical to form an optical connection with the photodiode 114. The optical waveguides 182 may thus provide optical signal feeds from optical fibers 840 to each photodiode 114 of the antenna array module 100. The distributed optical waveguides 182 may be fed to the micro-bends 505 of each individual unit cell 100a of the photodiode antenna array module 100 to achieve efficient coupling into the upper direction with minimum beam divergence.

A surface mount connector 184, including a plurality of bias input line pairs 122, may be arranged at a second edge 190b that is perpendicular to the first edge 190a. The plurality of bias input line pairs 122 may be configured to provide bias to the anode 114a and cathode 114b of each photodiode 114.

In this example, two package monitor lines 186a and 186b extend from the optical connector 180 at the first edge 190a to the third edge 190c that is opposite and parallel to the first edge 190a. As described below, package monitor lines 186a, 186b may assist in connecting the optical connector 180 and/or the input optical fibers 840 to the antenna array module 100.

FIG. 1E illustrates an embodiments in which the antenna array module 100 includes front-illuminated photodiodes 114. As shown in FIG. 1E, in such an embodiment, photodiodes 114 may be flip-chip bonded to a substrate 119, and the substrate 119 may be flip-chip bonded to the signal feed module 117. Pillars 125 may be provided between the anode 114a and radiating arm 110a and between cathode 114b and radiating arm 110b. The pillars 125 may provide an electrical connection between photodiode 114 and dipole antenna 110.

In the disclosed embodiments, antenna array module 100 may have a low profile, be light weight, and/or have good conformability (e.g., where the antennas of the antenna array are not all located in a single plane, such as being mounted on a surface of a convex shaped hull or wing of an aircraft). Although the embodiments of FIGS. 1A-1E are implemented with dipole antennas 110 and provides details of a phased array antenna module 100 (also referred to herein as a "phased array") implemented as a tightly coupled array ("TCA") of dipole antennas 110, it will be apparent that the invention is applicable to single antennas that need not be part of an array, as well as other types of antenna array. For example, the invention may be implemented (as an array or as a single antenna) with other antennas and with dipole antennas having different configurations, including monopole antennas, horn antennas, fractal antennas, loop antennas, patch antennas, spiral antennas, etc. The antenna array may be implemented as a current sheet antenna (CSA) that can be realized by connected-dipole arrays wherein adjacent dipoles are connected. CSAs may take many different forms of antennas such as: connected-dipole arrays which may possess lower cross polarization in radiation, less reactive energy confined in the feed, and broader impedance matching independently from the scan angle; interleaved spiral arrays which may have a wide bandwidth (often with relatively high cross polarization); and fragment arrays which may exploit a genetic algorithm (GA) to synthesize broadband apertures.

Further exemplary details of an antenna array module 100, including details of the photodiodes 114, dipole antennas 110, their arrangement and operation, as well as alternatives to the same, that may also be implemented as part of the present invention are disclosed in U.S. patent application Ser. No. 15/242,459, filed Aug. 19, 2016, and U.S. patent application Ser. No. 15/481,382, filed Apr. 6, 2017, in the U.S. Patent and Trademark Office, both of which are incorporated by reference in their entireties.

Further exemplary details of photodiodes 114 and substrate 119 that may be used in combination with the feed signal modules 117, their arrangement and operation, as well as alternatives to the same, that may also be implemented as part of the present invention are disclosed in U.S. patent application Ser. No. 15/909,598, filed Mar. 1, 2018, in the U.S. Patent and Trademark Office, entitled "DIAMOND-BACKED PHOTODIODES, DIAMOND-SANDWICHED PHOTODIODES, PHOTODIODES SYSTEM AND RELATED METHODS OF MANUFACTURE," by Peng Yao, (a non-provisional of U.S. Provisional Application No. 62/465,179, filed Mar. 1, 2017, and U.S. Provisional Application No. 62/486,475, filed Apr. 18, 2017, to which this concurrently filed non-provisional application claims priority), the entire contents of all of which are incorporated herein by reference.

Figure 2:
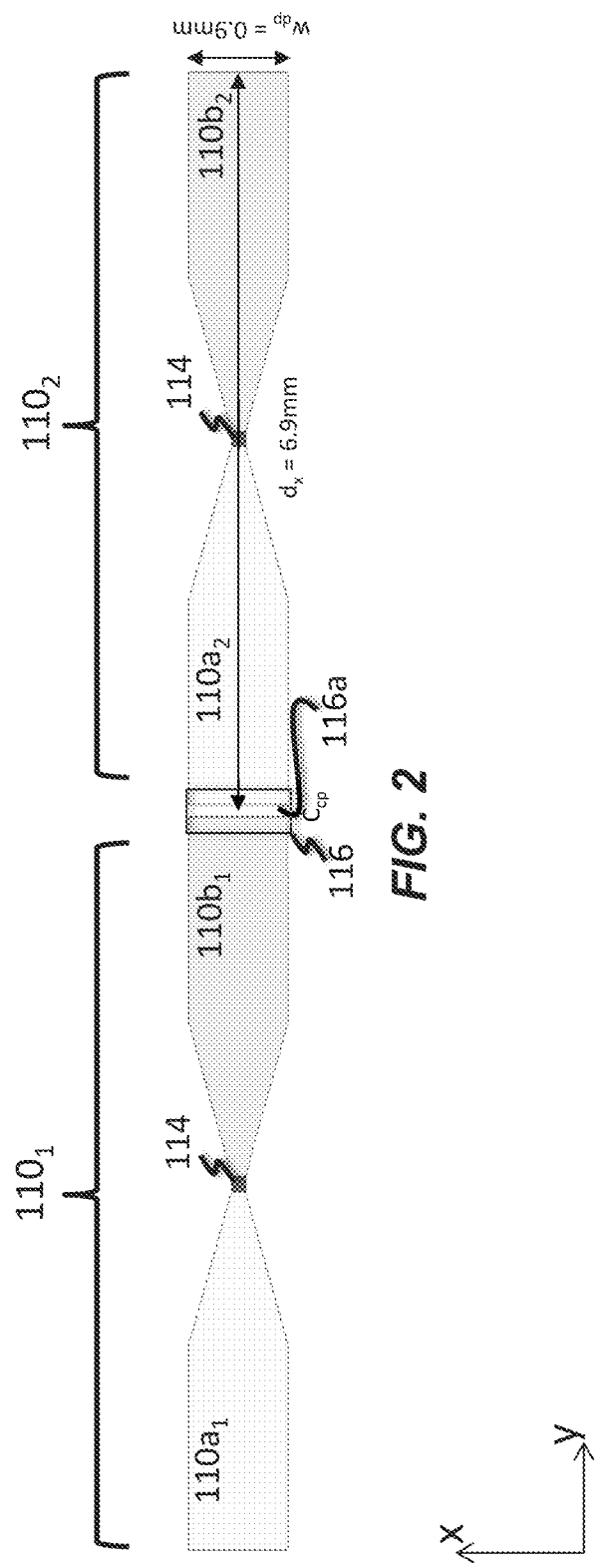
FIG. 2 illustrates exemplary details of two of the dipole antennas of two neighboring unit cells of FIG. 1, according to certain exemplary embodiments.

FIG. 2 illustrates exemplary details of the dipole antennas 110 of two neighboring unit cells 100a of FIG. 1A. The two dipole antennas 110 are aligned in a row of a plurality of these dipole antennas 110, this example row extending in the y-direction of FIG. 1A. As shown in FIG. 2, the radiating arm $110b_1$ of dipole antenna $110_1$ is adjacent to radiating arm $110a_2$ of dipole antenna $110_2$. Dipole antennas $110_1$ and $110_2$ may have the same shape and size. In this example, the radiating arms 110a and 110b of the dipole antennas 110 are formed as metal plate or a planar sheet of metal, such as gold, silver or aluminum. The radiating arms 110a and 110b may be connected to the anode 114a and cathode 114b of the photodiode 114 by a flip-chip connection of a photodiode semiconductor chip or by mounting the backside of a semiconductor chip to the upper surface of the signal feed module 117 and providing electrical connections between antenna 110 and photodiode 114 pairs with through substrate vias (formed in the photodiode semiconductor chip) or with wirebond connections. As described herein, each of the photodiodes 114 may be formed in a separate semiconductor chip or plural ones (in some instances, all photodiodes) may be formed within the same semiconductor chip.

Capacitor 116 may electrically connect the dipole antennas $110_1$ and dipole antenna $110_2$. The capacitor 116 may be a discrete component with one electrode of the capacitor 116 electrically connected to radiating arm $110b_1$ and the other electrode of the capacitor 116 electrically connected to radiating arm $110a_2$. Instead of or in addition to a discrete component, the structure of the capacitor 116 may comprise the outer conductive surfaces of radiating arm $110b_1$ and radiating arm $110a_2$ (as the electrodes of the capacitor 116) and the insulative material (e.g., air and/or the material of the signal feed module 117, such as polyimide) in the gap 116a between radiating arm $110b_1$ and radiating arm $110a_2$ (as the dielectric of the capacitor 116). To achieve a desired capacitance without use of an additional discrete capacitor, the spacing (e.g., the width of gap 116a) between the radiating arms $110b_1$ and $110a_2$ of neighboring dipole antenna $110_1$ and dipole antenna $110_2$ may be small, such as 50 µm or less. In some embodiments, the spacing (e.g., the width of gap 116a) between the radiating arms $110b_1$ and $110a_2$ of neighboring dipole antenna $110_1$ and dipole antenna $110_2$ may be 20 µm or less or, in certain embodiments, 5 µm or less. The capacitance of capacitor 116 may then be 0.01 pF or more, or 0.02 pF or more. The shapes, dimensions and spacing shown in FIG. 2 are exemplary. In particular, the dimensions and capacitance values will be dependent on the desired frequency range of the dipole antenna 110 and/or antenna array module 100 and can thus significantly vary from this embodiment.

Figure 3A:
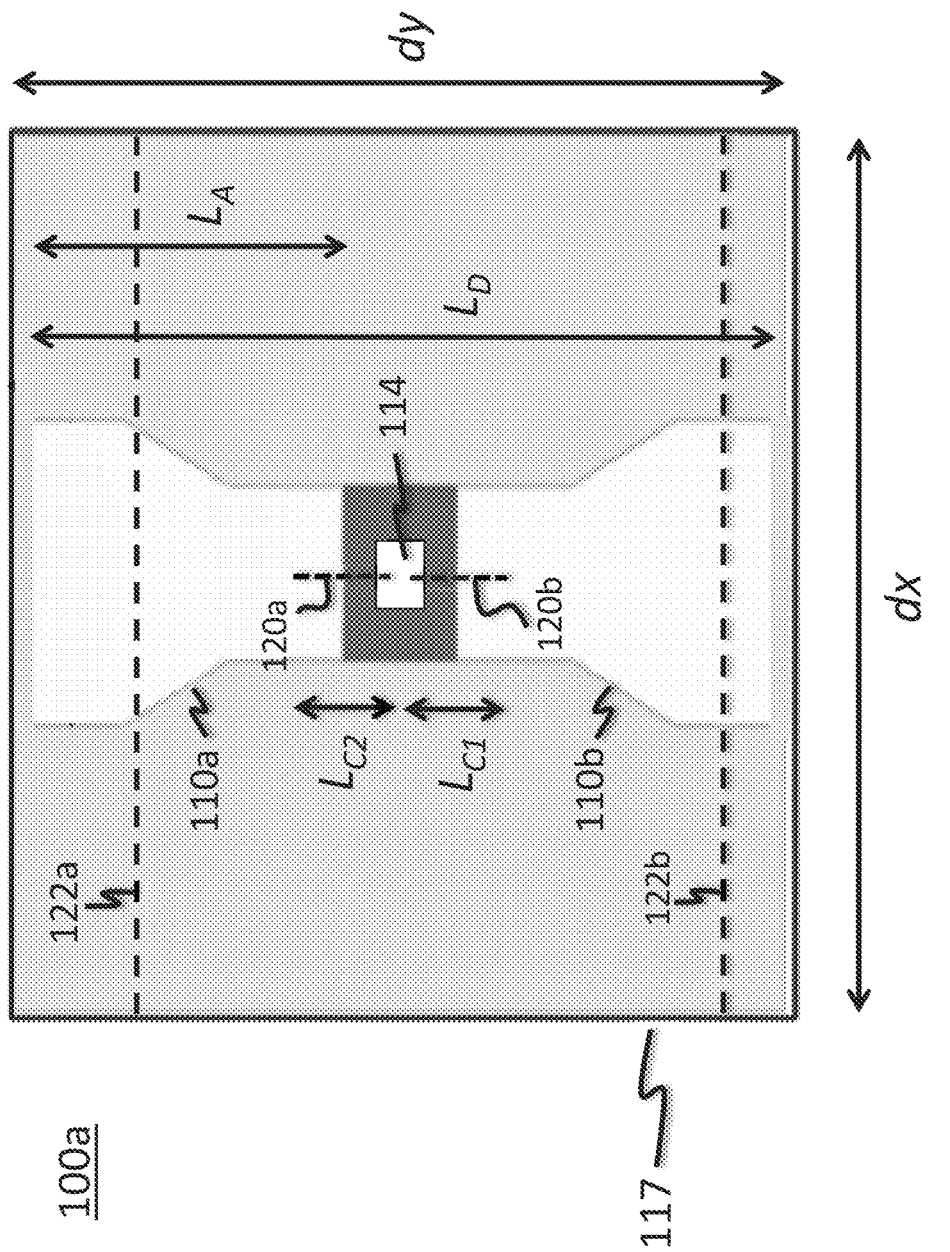
FIG. 3A is a simplified top down view and FIG. 3B is a bottom up view (absent the ground plane 18) of an exemplary unit cell, according to certain exemplary embodiments.
Figure 3B:
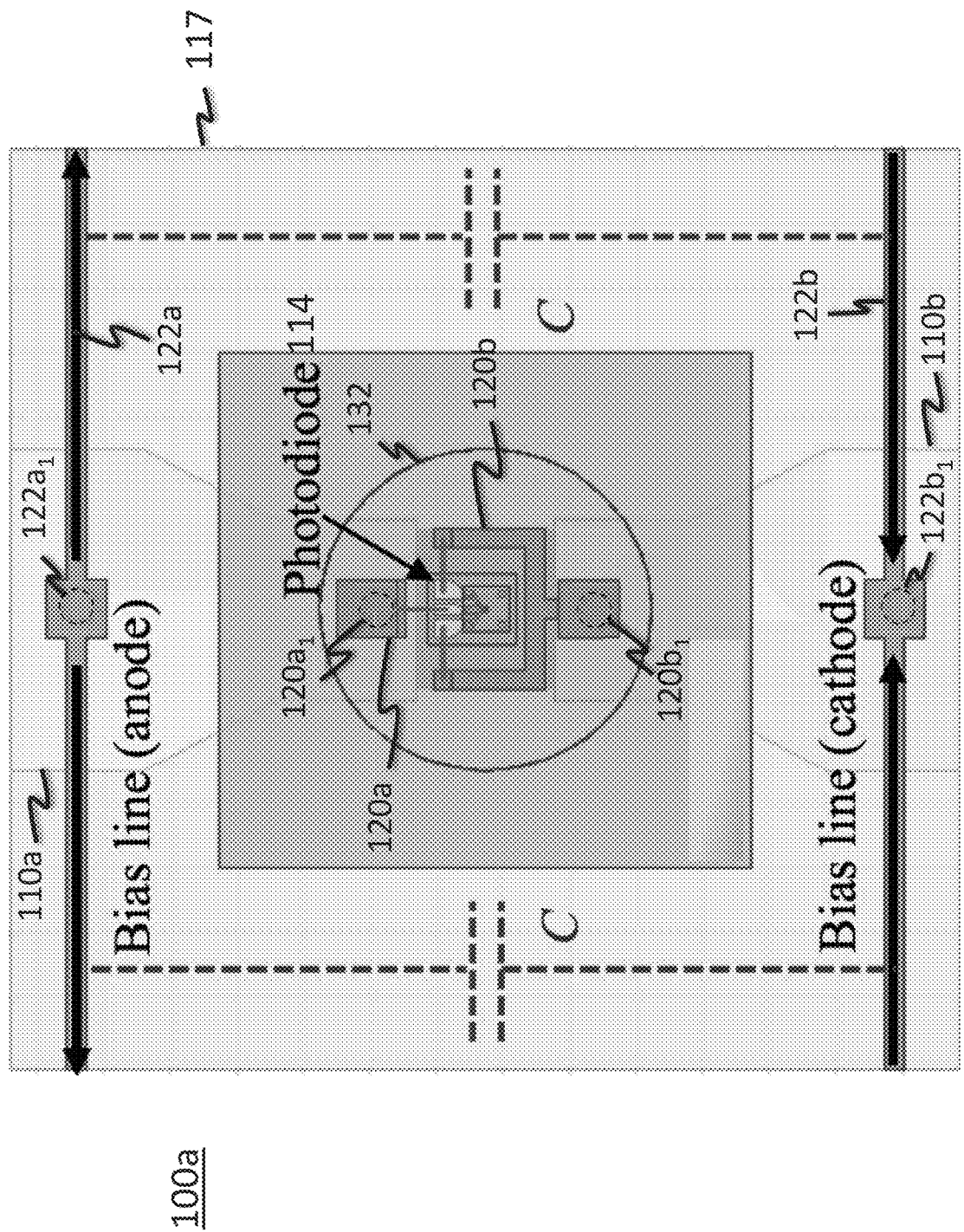
Figure 3C:
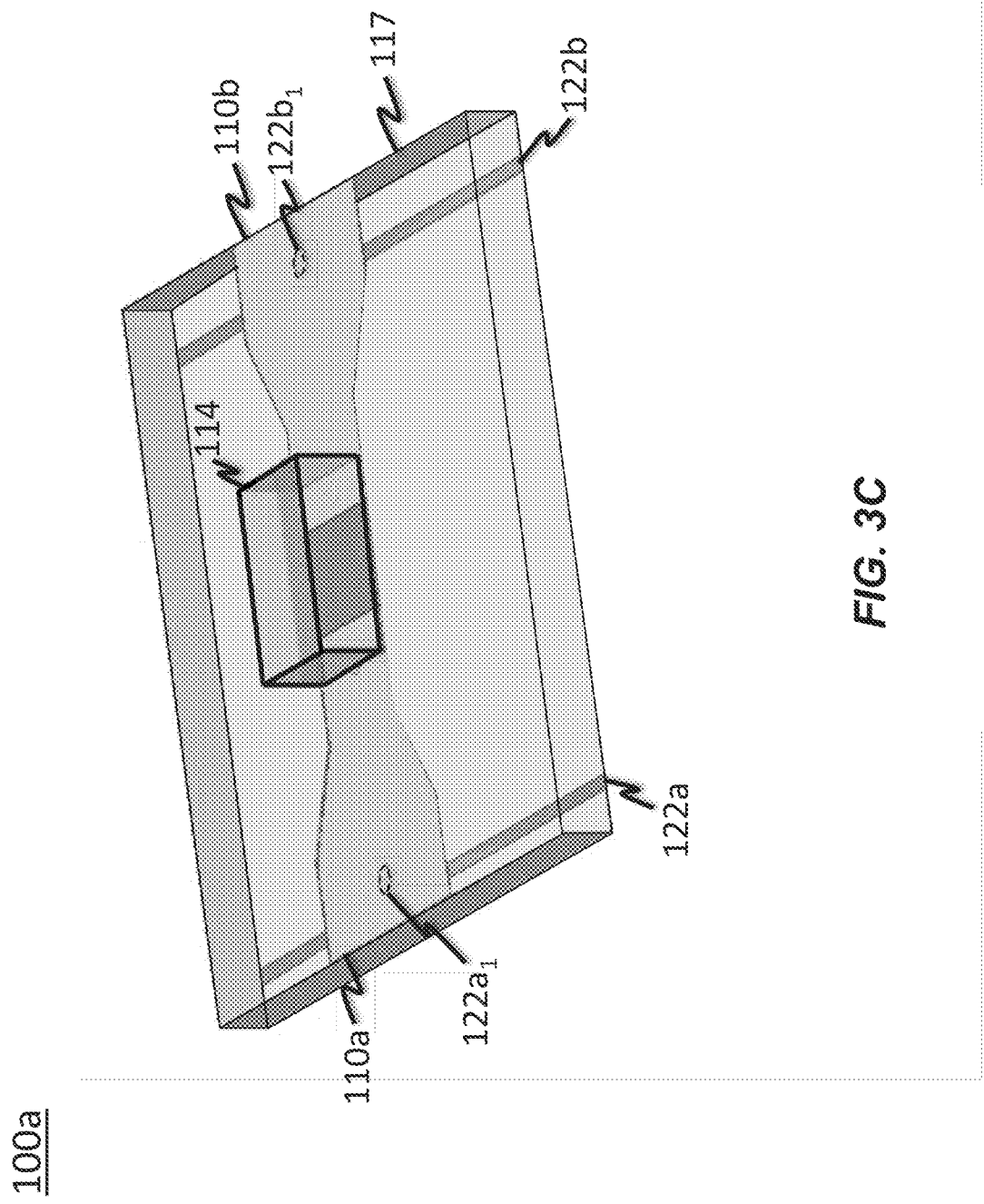
FIG. 3C is a perspective view of the unit cell, according to certain exemplary embodiments.

FIG. 3A is a simplified top down view and FIG. 3B is a bottom up view (absent the ground plane 118) of an exemplary unit cell 100a of the phased antenna array module 100 of FIGS. 1A and 1B. FIG. 3C is a perspective view of the unit cell 100a of the phased antenna array module 100 of FIGS. 1A and 1B (with ground plane 118 removed), illustrating the antenna 110 and photodiode 114 formed on a top side of the signal feed module 117 and the bias lines 122 formed on the bottom side of the signal feed module 117. All details described herein in connection with FIG. 2 also relate to the following description—only the shape of the radiating arms 110a and 110b of FIGS. 3A-3C differ from those shown in FIG. 2 but otherwise the details described and illustrated regarding FIG. 2 will be understood to be applicable to phased antenna array module 100 including the following description.

As shown in FIGS. 3A, 3B, and 3C, the unit cell 100a comprises a photodiode 114 electrically connected to radiating arms 110a and 110b of antenna 110 by conductors 120a and 120b, respectively. Conductors 120a and 120b may connect respectively to the radiating arms 110a and 110b $120b_1$. The conductors 120a and 120b may comprise, for example, conductive bumps, wiring formed form a metal pattern on the upper surface of the signal feed module 117, metal bond wires or conductive posts that extend away from an upper surface of the respective one of radiating arm 110a and 110b.

As noted, the x-y dimensions (top-down view dimensions) of the unit cell 100a are dx in the x-direction and dy in the y-direction. Both dx and dy may be chosen to be less than lambda/2 where lambda is the wavelength of the electromagnetic radiation emitted by phased array 100 at the highest frequency that phased array 100 is intended for use. The length of the dipole antenna 110 may be less than dy (e.g., by 5 µm or less, 20 µm or less, or 50 µm or less), or slightly less than lambda/2 in the substrate material to allow for a gap between neighboring dipole antennas 110 as discussed previously. The dipole antennas 110 may be fabricated on a signal feed module 117 formed of a material (e.g., substrate material) with a high dielectric constant, i.e., 3.66. For example, if the phased array 100 is designed to operate for 4-15 GHz, the wavelength of the emitted electromagnetic radiation may be 100 mm-25 mm. In this case, lambda is equal to 25 mm (corresponding to the highest frequency of 12 GHz). The use of high dielectric constant substrate will also reduce the wavelength in the antenna substrate by a factor of the effective reflective index between substrate and air sqrt(3.66+1), so wavelength=25/sqrt(1+3.66)=16.4 mm. The length (from tip to tip in they direction) of individual dipole antennas 110 may be less than lambda/2 in the medium or 8.2 mm (16.4 mm/2) or less. The dx and dy dimensions of the unit cell 100a may also be equal to or less than lambda/2, or 7.5 mm or less in this example.

The lengths $L_{C1}$ and $L_{C2}$ of each of the conductors 120a and 120b also may be less than lambda/2 (e.g., less than the dipole antenna length) and, more specifically, less than lambda/4 (e.g., less than half of the dipole antenna length, or less than the length of a radiation arm 110a or 110b of the dipole antenna 110). In this example, conductors 120a and 120b are each 0.3 mm or less. By keeping conductors 120a and 120b short in total length (e.g., less than half of the dipole antenna 110 length, or less than the length of a radiation arm 110a or 110b of the dipole antenna 110), conductors 120a and 120b may provide the driving current to the radiating arms 110a and 110b of the dipole antenna 110 without causing problems that might otherwise result from electromagnetic radiation being emitted from conductors 120a and 120b. Thus, the anode and the cathode of the photodiode 114 may be respectively connected to the radiating arms 110a and 110b without requiring a transmission line (e.g., without an RF waveguide) and the resulting signal imbalance resulting from use of a transmission line. Thus, baluns may not be necessary, providing a significant reduction in cost, size and complexity.

Anode bias lines 122a and cathode bias lines 122b may extend in the x-direction of FIG. 1A within and/or on the upper surface of signal feed module 117. In the example of FIG. 1A, anode bias line 122a, cathode bias line 122b and antennas 110 are formed from the same metal layer on the upper surface of the signal feed module 117. This metal layer may be patterned using photolithography as described below. Each anode bias line 122a electrically connects radiating arms 110a of a group of antennas 110 aligned in the x direction of signal feed module 117 and each cathode bias line 122b electrically connects radiating arms 110b of a group of antennas 110 aligned in the x direction. A bias voltage may thus be applied to the anode 114a and cathode 114b of each photodiode 114 through a bias voltage applied through the corresponding anode and cathode bias lines 122a, 122b, antenna radiating arms 110a, 110b, and conductors 120a, 120b.

Each of the anode bias line 122a and the cathode bias line 122b may be comprised of conductive wires, and each of the anode bias line 122a and the cathode bias line 122b may be made sufficiently thin so that the bias lines 122a and 122b have a much higher impedance than the radiating arms 110a and 110b of the dipole antenna 110. Thus, radiation from these bias lines 122a and 122b may only become problematic at a frequency much higher than the operating frequency of the dipole antennas 110. For instance, if the antenna is designed at 5-20 GHz, the radiation from two bias lines 122a and 122b may only start to occur at frequencies of 25 GHz or greater. Thus, the presence of the bias lines 122a and 122b may not have a significant impact on the dipole antenna radiation over the interested frequency band. However, in designs where the operating frequencies of the dipole antenna 110 may be in a range where the anode bias line 122a and cathode bias line 122b start to radiate (e.g., at 25 GHz or greater in the above example), the bias lines 122a and 122b may be shielded, such as by the ground plane 118. Additionally or alternatively, a first inductor may be connected between the anode bias line 122a and the anode of the photodiode 114, and a second inductor may be connected between the cathode bias line 122b and the cathode of the photodiode 114. The first and second inductors may act as RF chokes to filter the RF signal from the DC signal so that only the DC signals (e.g., ground or Vbias) are provided to the photodiode 114.

Anode bias line 122a may extend across the array of dipole antennas 110 of the phased antenna array module 100 to connect the radiating arms 110a of antennas 110 that are aligned in a row in the x-direction. The anode bias line 122a may be connected to ground or other reference DC voltage. The cathode bias line 122b may be connected to voltage source to provide a DC bias voltage Vbias. Together, the anode bias line 122a and cathode bias line 122b may apply a reverse bias voltage across the photodiode 114 of the unit cell 100a to which they are connected (along with all other photodiodes of the unit cells 100a of the phased antenna array module 100 to which they are connected). Specifically, a ground voltage (potential) may be applied to the anode 114a of photodiode 114 due to the electrical connection of the photodiode anode 114a to the anode bias line 122a through conductor 120a and radiating arm 110a. The DC bias voltage Vbias is applied to the cathode 114b of photodiode 114 due to the electrical connection of the photodiode cathode 114b to cathode bias line 122b through conductor 120b and radiating arm 110b.

Although not illustrated, in some embodiments, the unit cell 100a may also include a resistor and/or a spacer. In such embodiments, the resistor may be connected between radiating arms 110a and 110b. For example, the resistor may be a chip resistor directly mounted on the upper surface of the radiating arms 110a and 110b. In embodiments including a spacer, the spacer may contact and be sandwiched between upper surface feed module 117 and an opposing surface of substrate 119 of the photodiode 114 (or a submount on which the photodiode 114 is mounted). The spacer may act to provide a desired spacing between photodiodes 114 and an associated micro-bend 505. Photodiode 114 may be mounted to an upper surface of signal feed module 117 at a location to receive light reflected via the micro-bend.

The light transmitted via the optical waveguides 182 and the micro-bend, and detected by photodiode 114 may be infrared, such as near infrared, but other light may be used as well. A lens (not shown) may also be positioned between the photodiode and the micro-bend 505 (or be made part of photodiode chip packaging) to guide light onto the PIN junction of the photodiode 114.

Referring to FIG. 3B, micro-bend area 132 is identified with a circular line to indicate a location of a micro-bend 505 (not shown in FIG. 3B) relative to the photodiode 114. As reflected in FIG. 3B, a micro-bend area 132 may be located below and aligned with each photodiode 114. As discussed further below, the micro-bend 505 may be formed in the signal feed module 117. The micro-bend 505 may be a reflector or prism that is configured to receive an optical signal received from the terminal end of an optical waveguide 182 and redirect the optical signal to a corresponding photodiode 114.

In some embodiments, photodiode 114 may be directly mounted on signal feed module 117. Each pair of antenna radiating arms 110a and 110b may be formed from a metal pattern on the top of the signal feed module 117, and a corresponding photodiode 114 may be mounted thereon. For example, conductive metal bumps (e.g., gold bumps) may electrically connect the antenna 110 and photodiode 114 together.

The photodiode 114 may receive the optical signal transmitted through optical waveguide 182 and redirected in the micro-bend area 132 by the micro-bend 505, and convert the optical signal to an RF electrical signal that then drives antenna 110. See, e.g., U.S. Ser. No. 15/410,761, incorporated by reference in its entirety, for exemplary systems and methods to generate, modulate and transmit optical signals, to drive a photodiode coupled antenna, as well as coordinating such optical signal generation for a plurality of antennas to drive an antenna array in various manners.

Figure 4:
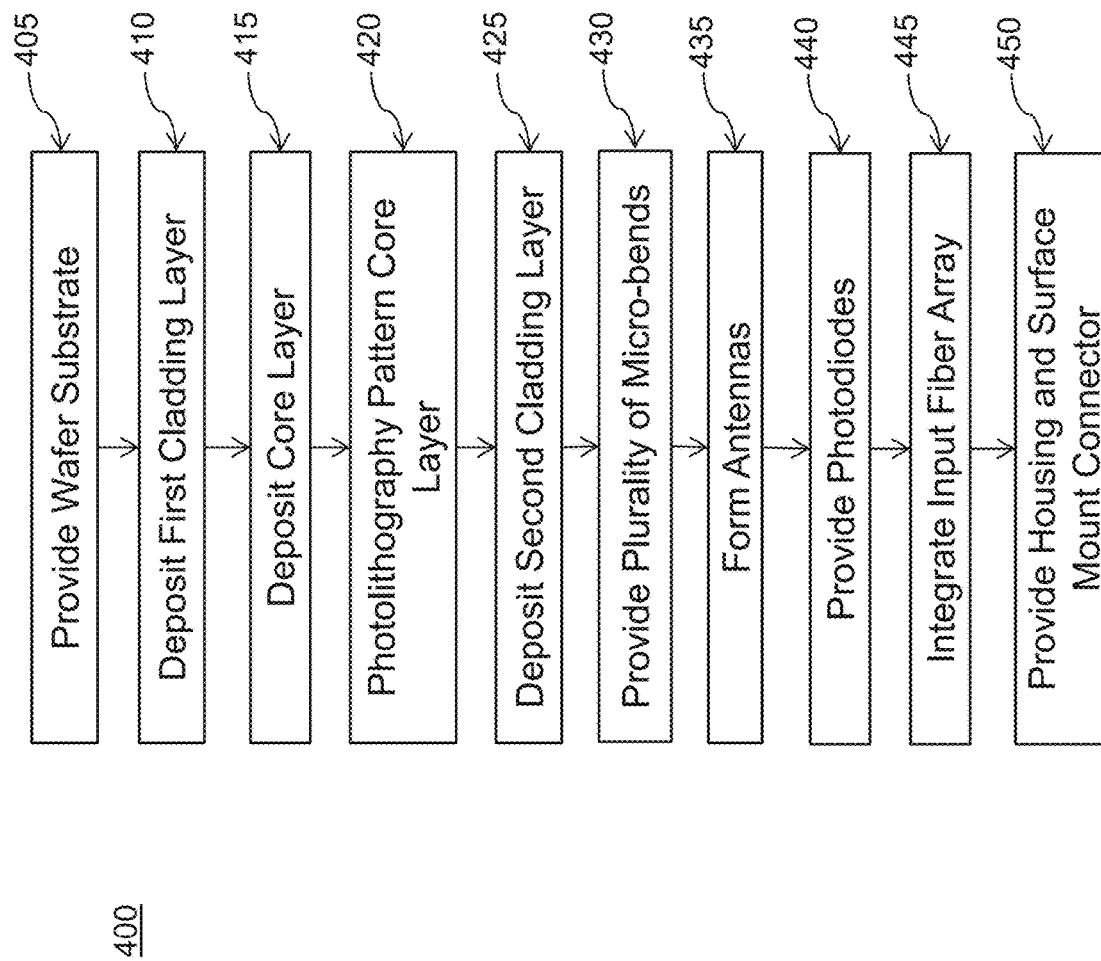
FIG. 4 is a flowchart of a method of forming an optically-distributed feed module, according to certain exemplary embodiments.

FIG. 4 is a flowchart of a method for manufacturing the optically distributed signal feed module 117 of FIG. 1A, according to certain exemplary embodiments. FIGS. 5A through 5G are side views and FIGS. 5H and 5I are perspective views in connection with the method 400 of FIG. 4.

Figure 5A:
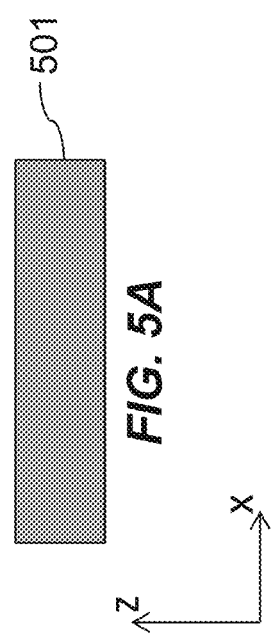
FIGS. 5A-5L are diagrams illustrating a method of forming an optically-distributed feed module, according to certain exemplary embodiments.

Referring to FIGS. 4 and 5A, a wafer substrate 501 may be provided (step 405). The wafer substrate 501 may be a crystalline substrate, such as quartz wafer substrate. The quartz wafer substrate 501 may be transparent in the RF domain (e.g., having a low RF index), and may be complementary metal oxide semiconductor (CMOS) compatible.

Figure 5B:
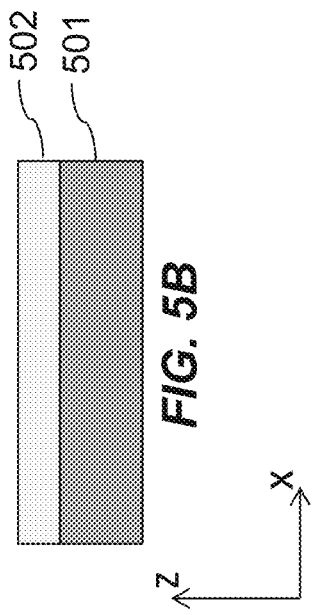

Next, referring to FIGS. 4 and 5B, a first cladding layer 502 may be formed on the wafer substrate 501 (step 410). The first cladding layer 502 may be a silicon oxide ($SiO_2$), and may be deposited to a thickness of less than 5 μm, such as between 3 μm and 5 μm or less than 3 μm, or more particularly. In some embodiments, a chemical mechanical polishing (CMP) process may be performed to planarize a top surface of the first cladding layer 502.

Figure 5C:
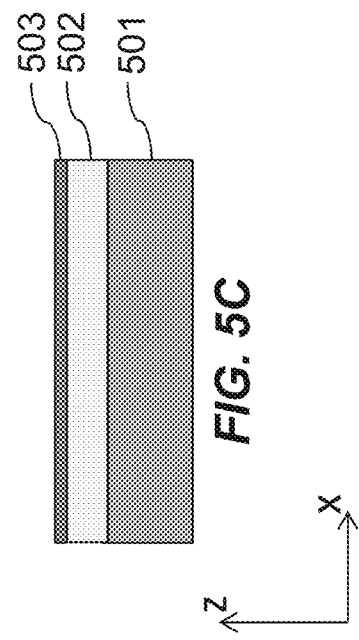

Referring to FIGS. 4 and 5C, a core layer 503 may be deposited on the first cladding layer 502 (step 415). The core layer 503 may be a silicon nitride layer ($Si_3N_4$), and may be deposited to a thickness of less than 0.4 μm, such as about 0.1 μm to about 0.4 μm, for example about 0.2 μm. In some embodiments, a CMP process may be performed to planarize a top surface of the core layer 503.

Next, the core layer 503 may be photolithographically patterned to form optical waveguide cores (step 420). The optical waveguide cores may correspond to the cores of the optical waveguides 182 of FIG. 1A. For example, a combination of the optical waveguide cores and the cladding surrounding the cores may form the optical waveguides 182. In addition, two additional optical waveguide cores may be provided, and their outputs are routed across the core layer 503 in the y-direction. The two additional optical waveguide cores may form package monitor lines 186a, 186b.

To pattern the core layer 503 using photolithography, a photoresist layer may be formed on the core layer 503 (not illustrated), the photoresist may be selectively exposed to light with a photolithography process. The photoresist may then be developed to remove either the exposed or non-exposed portions of the photoresist resulting in patterning the photoresist. The core layer 503 may then be patterned by etching using the patterned photoresist as a mask or using a hard as an etchant mask (where the hard mask is a layer formed on core layer 503 and patterned by etching using the patterned photoresist). In some embodiments, the patterned optical waveguides 182 may have inverse taper designed to achieve efficient coupling to an optical fiber, i.e., insertion loss<0.5 Db. The patterned optical waveguides 182 may have little loss (e.g., <3 dB/m), and may provide flexible control of optical mode size and thereby maximum optical power handling. In some embodiments, as discussed more fully below in connection with FIG. 7A, when the micro-bends 505 are comprised of gratings, the gratings may be patterned as part of patterning (e.g., simultaneously with) the core layer 503.

Figure 5D:
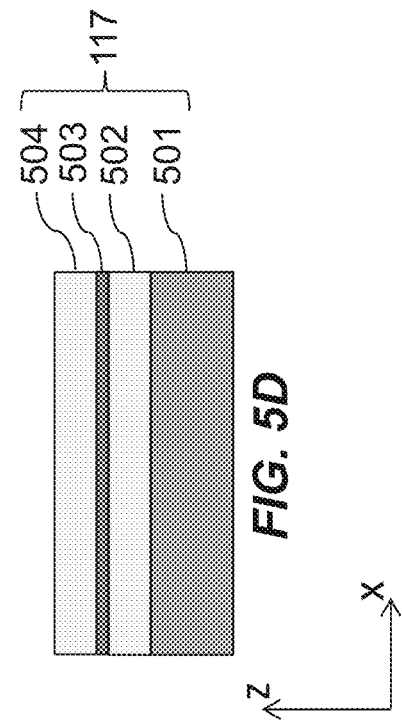
Figure 5F:
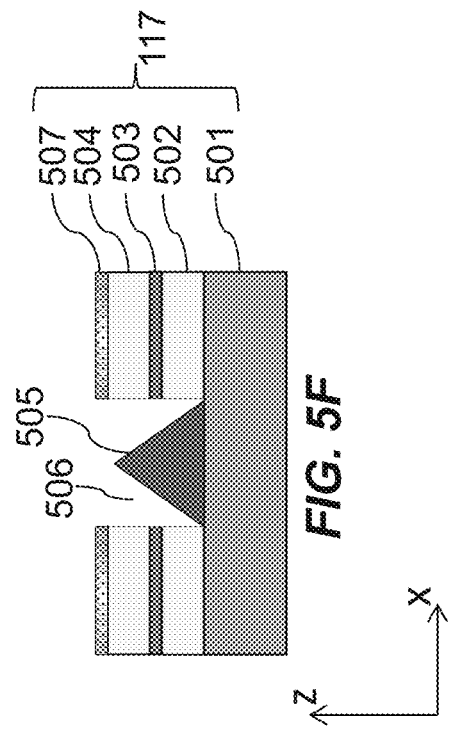

Referring to FIGS. 4 and 5D, a second cladding layer 504 may be deposited (step 425). The second cladding layer 504 may be a silicon oxide (SiO$_2$) and may be deposited to a thickness of less than 6 μm, such as about 2 μm to about 6 μm, for example, 4 μm. In some embodiments, a CMP process may be performed to planarize a top surface of the second cladding layer 504.

Figure 5E:
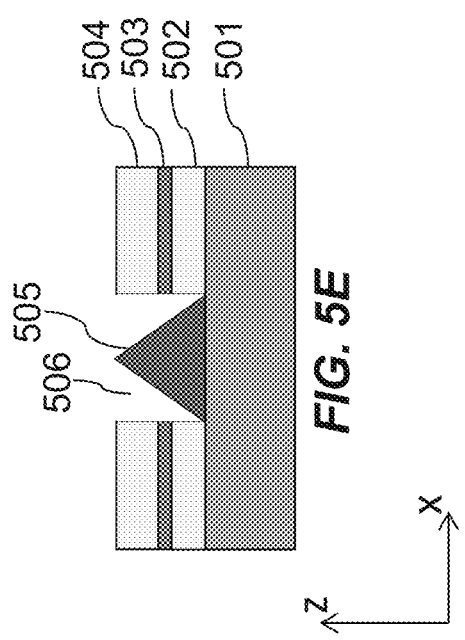
Figure 5H:
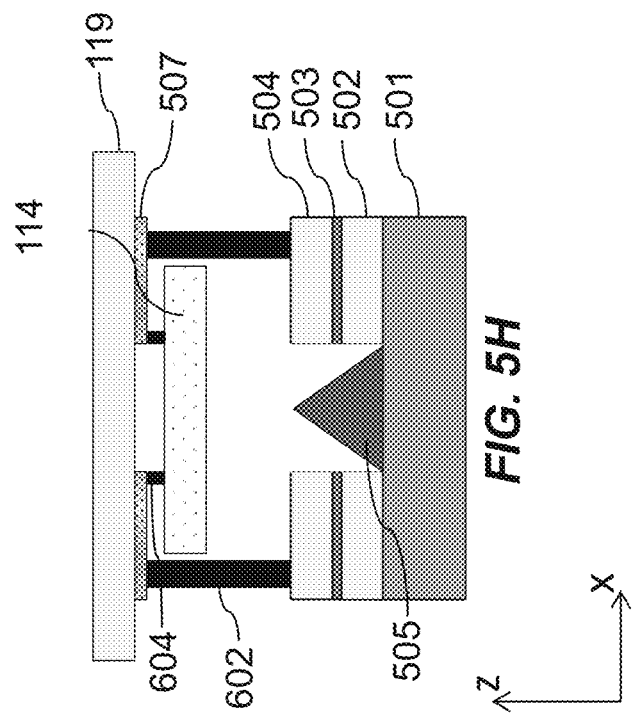

Referring to FIGS. 4 and 5E, a plurality of micro-bends 505 may be provided (step 430). For example, as illustrated in FIG. 5E, an opening 506 may be patterned in the stack consisting of the first cladding layer 502, the core layer 503, and the second cladding layer 504, and a micro-bend 505 may be provided in the opening 506 on the top surface of the wafer substrate 501 that is exposed by the patterning. Each micro-bend 505 may be provided at a location where a photodiode 114/antenna 110 pair is located. In this example, the number of micro-bends 505 is equal to the number of photodiodes 114 of the photodiode antenna array module 100. Each micro-bend 505 may be a micro-90°-bend, and the plurality of micro-bends 505 may form a micro-bend array. The micro-bends may be used to achieve a 90° turn in the optical signal received via the optical waveguides (see, e.g., optical waveguides 182 of FIG. 1A). For example, an optical signal may be transmitted through the optical waveguides 182 and impinge on micro-bend 505. When the optical signal reaches a micro-bend 505, the micro-bend 505 may cause the optical signal to be redirected upwards toward the photodiode 114. Embodiments of micro-bends are discussed further below in connection with FIGS. 7A-7E.

Referring to FIGS. 4 and 5F, a patterned conductive metal layer 507 may be formed on the second cladding layer 504 (step 435). The patterned metal layer 507 may form various conductive elements such as dipole antennas 110 and anode and cathode bias lines 122a, 122b as described herein, as well wiring and bonding pads. For example, the patterned metal layer 507 may be formed depositing and then patterning an insulator (e.g., by etching the insulator using a photolithographically patterned photoresist or hard mask as an etchant mask as described herein), depositing a conductive metal within openings of and on upper surfaces of the patterned insulator, and performing a CMP process to remove the metal deposited on and to expose the upper surface of the patterned insulator and leave metal within the openings of the patterned insulator. In this example, the metal layer forming the radiating arms 110a and 110b may be the uppermost metal layer of the optical feed module 117.

However, in other examples, the radiating arms 110a and 110b may be formed elsewhere and/or at different stages in the process. For example, with reference to FIG. 5H, the patterned metal layer 507 may be formed on the bottom side of substrate 119 (i.e., the side facing photodiode 114) between the substrate 119 and photodiode 114. As shown in FIG. 5H, first conductive pillars 602 may be provided to extend from a top surface of the cladding layer 504 to a surface of the patterned metal layer 507, and second conductive pillars 604 may be provided to extend between the surface of the patterned metal layer 507 and the backside of the photodiode 114. The second conductive pillars 604 may be in contact with and provide an electrical connection between the antennas 110 and the photodiode 114. As another example, with reference to FIG. 5I, the patterned metal layer 507 may be formed on the bottom side of substrate 119 (i.e., the side facing photodiode 114) between the substrate 119 and photodiode 114, and conductive pillars 604 may be provided to extend between the surface of the patterned metal layer 507 and the backside of the photodiode 114, thereby providing an electrical connection between the antennas 110 and the photodiode 114. As yet another example, with reference to FIG. 5J, the patterned metal layer 507 may be formed on the top side of substrate 119 (i.e., the side facing away from photodiode 114), and conductive vias 608 may be provided to extend from patterned metal layer 507 to photodiode 114 through substrate 119, thereby providing an electrical connection between the antennas 110 and the photodiode 114. Still other embodiments are contemplated, such as on the backside wafer substrate 501 by patterning metal deposited on the backside of the wafer substrate 501. In other examples, such as embodiments having a patch antenna, rather than dipole antennas, the patterned metal layer 507 may form part of an RF transmission line, such as forming a portions of (e.g., wiring strips) a coplanar waveguide (CPW) or microstrip. In such examples, prior to forming patterned metal layer 507, additional metal layers and dielectric layer separating the variously formed conductive metal layers of signal feed module 117 may be formed prior to or after forming patterned metal layer 507 (for example, to form patch antennas and a ground plane). In certain embodiments, patch antennas may be provided on a back side of the wafer substrate 501 (e.g., on a side opposite to that facing the first cladding layer 502).

Figure 5G:
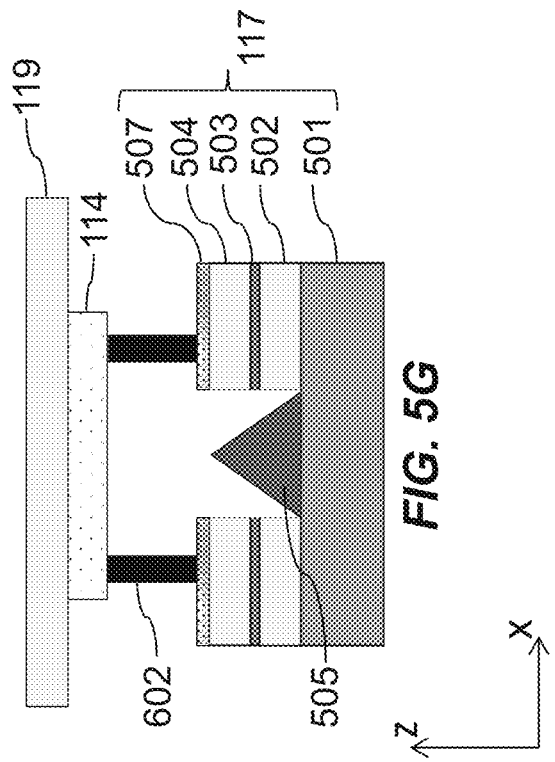
Figure 5I:
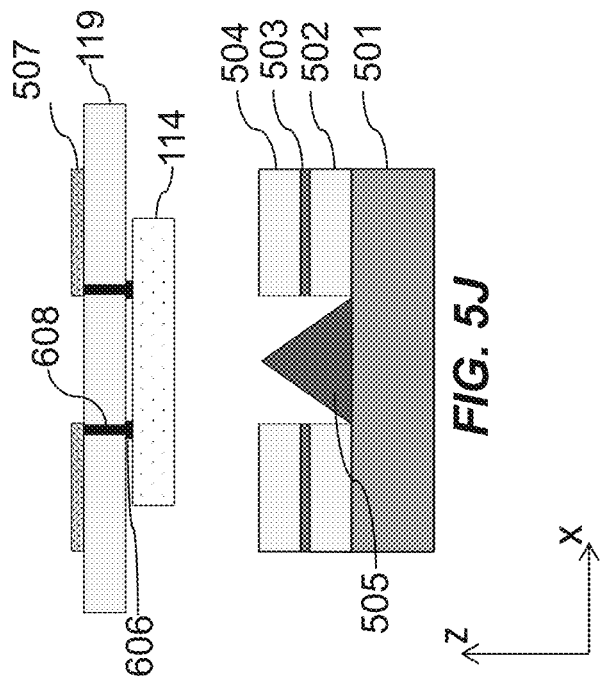
Figure 5J:
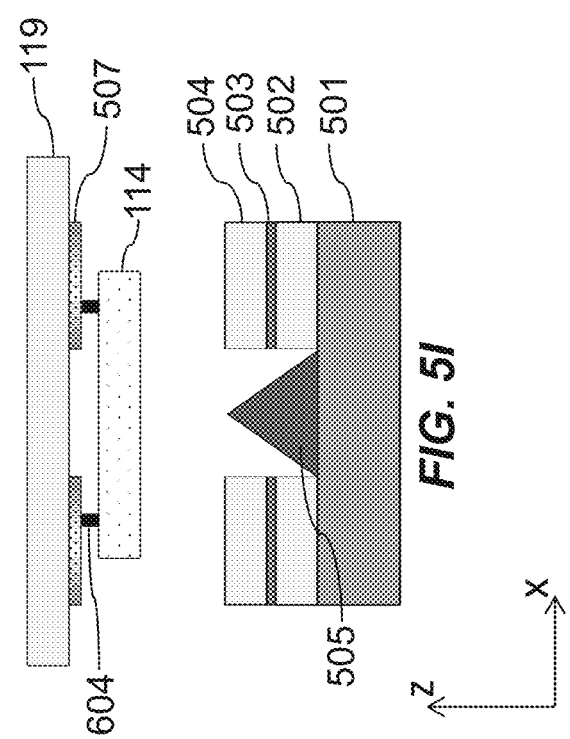

Referring to FIGS. 4 and 5G, an array of photodiodes 114 may be connected to the signal feed module 117 (step 440) via conductive pillars 602. For example, a plurality of photodiodes 114 may be integrally formed as a single semiconductor chip on a substrate 119 (e.g., a monolithic structure formed on a crystalline wafer substrate). Substrate 119 may be a semiconductor photodiode substrate (i.e., part the photodiode semiconductor chip including photodiode 114), such as indium phosphide (InP), on which the photodiodes 114 are formed (e.g., through epitaxially growing and patterning the semiconductor layers of the photodiodes to form the stacked P-I-N semiconductor functional layers of each photodiode 114). In this case, substrate 119 may be formed of a semiconductor wafer on which each photodiode 114 is formed by semiconductor manufacturing processes.

Substrate 119 may also comprise a monolithic substrate combined with the photodiodes 114 (such as a diamond substrate or aluminum nitride AlN) substrate. FIG. 6A illustrates an example of substrate 119 comprising a diamond or AlN substrate attached to the backside of a photodiode 114 with anode and cathode electrodes of the photodiode 114 exposed on the opposite front side of the photodiode 114. The exposed anode and cathode may thus be connected to the signal feed module 117 (e.g., through flip-chip mounting) by connecting the anode and cathode to the antenna arms 110a, 110b via conductive pillars 602. The diamond or AlN substrate may be formed on the photodiode semiconductor substrate (e.g., InP) or may replace the photodiode semiconductor substrate (e.g., after forming the photodiodes on the photodiode substrate, removing and replacing the semiconductor substrate (e.g., InP) with a diamond substrate or AlN substrate).

Figure 6B:
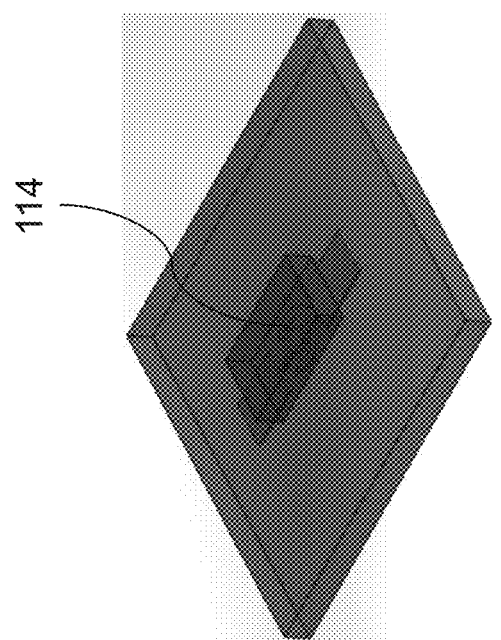
FIG. 6B is a diagram illustrating a back-illuminated photodiode, according to certain exemplary embodiments.
Figure 6A:
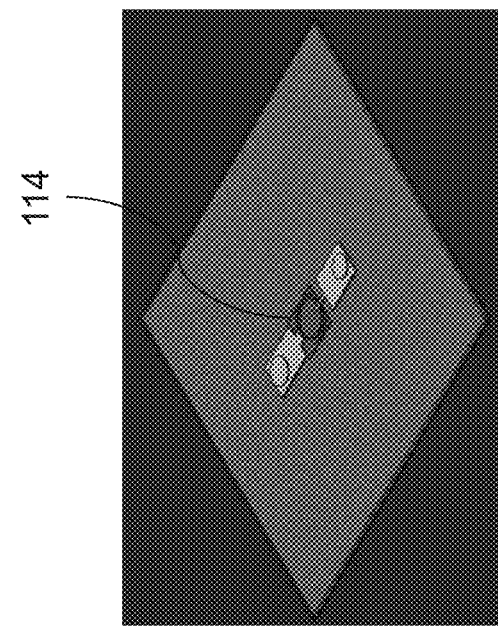
FIG. 6A is a diagram illustrating a front-illuminated photodiode, according to certain exemplary embodiments.

FIG. 6B illustrates an example of the photodiode 114 flip-chip mounted to substrate 119 (e.g., comprising a diamond or AlN substrate) with anode and cathode electrodes of the photodiode 114 connected to wiring formed on substrate 119 which is exposed at locations outside of the photodiode chip 114 to be connected to antenna radiating arms 110a, 110b via pillars 602.

The plurality of photodiodes 114 may be spaced apart in a 2-dimensional array having spacings and locations corresponding to those of the antennas 110 on signal feed module 117. The plurality of photodiodes 114 may be attached at the same time by electrically and physically connecting the plurality of photodiodes 114 integrally formed with substrate 119 to the signal feed module 117. In other examples, separate photodiode chips 114 may be flip-chip bonded to corresponding antennas 110 of the signal feed module 117 via conductive pillars 602. Although not illustrated in FIG. 5G, spacers may be provided between photodiodes 114 and the micro-bends 505 to provide a desired spacing therebetween, such as to allow spread of light beam from micro-bend 505 to photodiode 114 to fully cover the photodiode 114 active area (e.g., surface of PIN stack forming photodiodes 114).

In this embodiment, the photodiodes 114 may be mounted face-down with anode and cathode electrodes on the surface of photodiodes 114 facing the upper surface of the signal feed module 117. The anode and cathode electrodes of the photodiodes 114 may be connected with corresponding radiating arm 110a, 110b of an antenna 110 with a conductive pillar 602 (e.g., gold bump) contacting and extending between the anode or cathode and a corresponding landing pad formed by metal pattern 507 electrically connected to a radiating arm by wiring (e.g., of the metal pattern 507). In some examples, the anode and cathode electrodes of the photodiodes 114 may be connected with a corresponding radiating arm 110a, 110b of an antenna 110 with a conductive pillar 602 directly connected to (i.e., contacting) the corresponding radiating arm 110a, 110b.

In some examples, the photodiode 114 may be bonded to substrate 119, which may be in the process of fabricating the photodiode 114, and then the completed photodiode 114 with attached AlN/diamond substrate 119 may be mounted on the signal feed module 117. In another example embodiment, a plurality of photodiodes 114 may be formed within a single semiconductor wafer, and the photodiodes 114 may bonded to an AlN/diamond substrate 119. The photodiodes 114 may be formed at spacings corresponding to the spacings of the individual antennas 110, and groups of photodiodes 114 may be cut out of the semiconductor wafer to form a single semiconductor chip (i.e., each chip has plural PD devices at locations corresponding to the antennas on the substrate). In this embodiment, the photodiodes 114 may be flip-chip bonded to the antennas 110.

In some embodiments, multiple antenna arrays may be formed simultaneously on and cut from the same wafer substrate 501. In such embodiments, after the photodiodes 114 are provided, individual antenna array modules 100 may be singulated (i.e., cut wafer into chips).

Figure 5L:
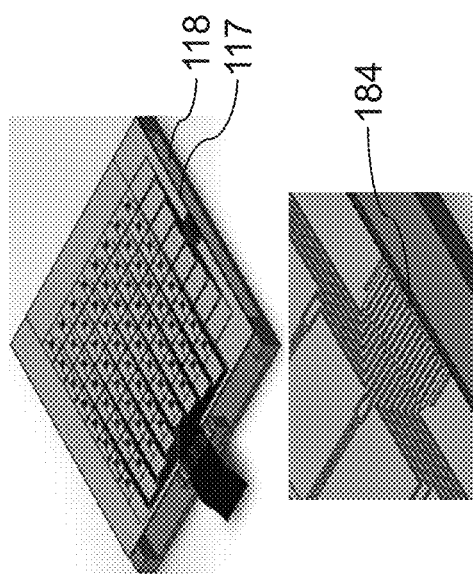
Figure 5K:
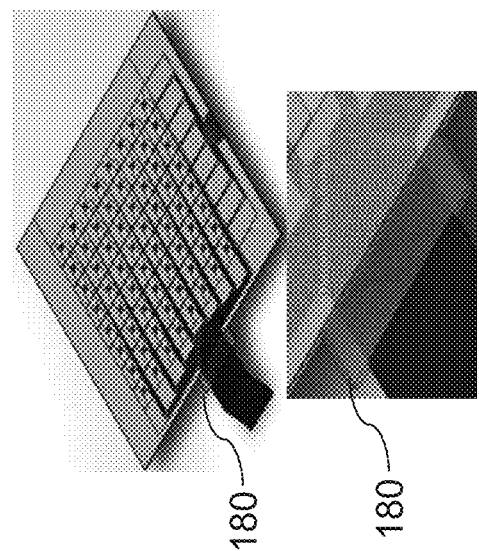

Next, referring to FIGS. 4 and 5K, antenna array module 100 may be integrated with a one-dimensional (1D) fiber array at optical connector 180 (step 445). Optical connector 180 may be a v-groove assembly having a plurality of v-grooves formed in its upper surface. Each v-groove of the v-groove assembly may have one of the optical fibers 840 placed therein. The v-groove assembly may be positioned so that each optical fiber is mated with a corresponding one of the optical waveguides 182 in a butt-to-butt connection). Additional optical waveguides (e.g., package monitor lines 186a, 186b) may help connect the input optical fibers at the v-groove assembly to the antenna array module 100. For example, during positioning of the optical connector 180 (for butt-to-butt connection to optical waveguides 182 of antenna array substrate), light may be transmitted from two of the optical fibers 840 to package monitoring lines 186a, 186b (also being optical waveguides), and output from package monitoring lines 186a, 186b at edge 190b and measured. The position of the optical connector 180 may be adjusted while this light intensity measurement process continues. The position of the optical connector 180 that corresponds to the maximum light intensity in positioning the optical connector 180 may be determined as the appropriate position to fix optical connector 180 using the package monitor lines 186a, 186b and this process. Although package monitor lines 186a, 186b are illustrated as two discrete positioning waveguides embedded in antenna module, in some embodiments, a package monitoring lines 186a and 186b may be implemented as a single waveguide loop where the ends of the monitoring waveguide loop are both connected to a corresponding one of the optical fibers 840. In this implementation, a first one of these optical fibers may provide the light input to the monitoring waveguide loop and a second one of these optical fibers may receive the output from this monitoring waveguide loop (at the optical connector), where light output from the second optical fiber is measured and used to position and fix the optical connector as described herein.

Finally, referring to FIGS. 4 and 5L, a housing and surface mount connector 184 may be provided (step 450). In some embodiments, the housing may be a metal housing. The housing may be attached to an underside of the antenna array module 100 and may form the ground plane 118 for the antenna array module 100. The surface mount connector 184 may be used to provide the bias voltage to the integrated photodiode antenna array module 100.

Also, though the above steps are described in a particular order, they need not occur in that order necessarily. As one example, the provision of micro-bends 505 may occur at differing points in the process based on the type of micro-bend 505 being provided, as discussed below in connection with FIGS. 7A through 7E.

FIGS. 7A-7E are diagrams illustrating example micro-bends 505, according to certain exemplary embodiments. In each of the embodiments of FIGS. 7A-7E, the micro-bends 505 may be provided at locations corresponding to where pairs of photodiodes 114 and antennas 110 are or will be placed.

Figure 7B:
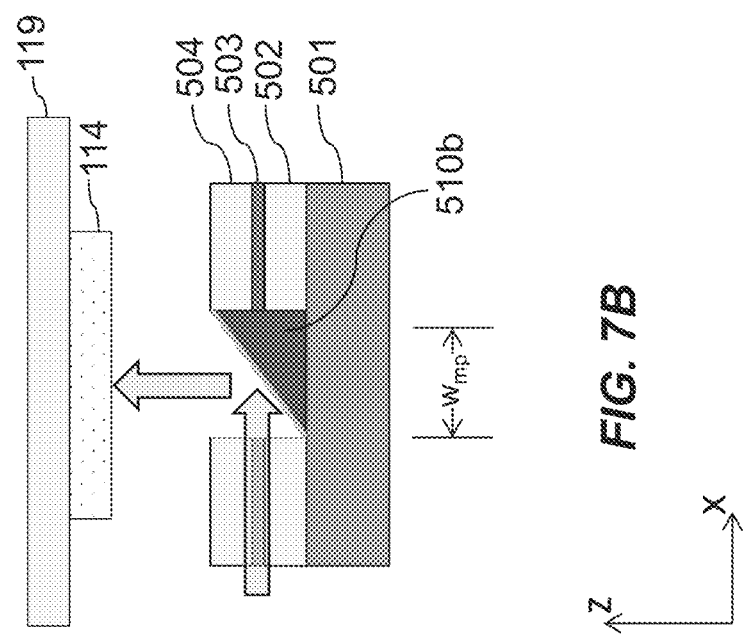
Figure 7A:
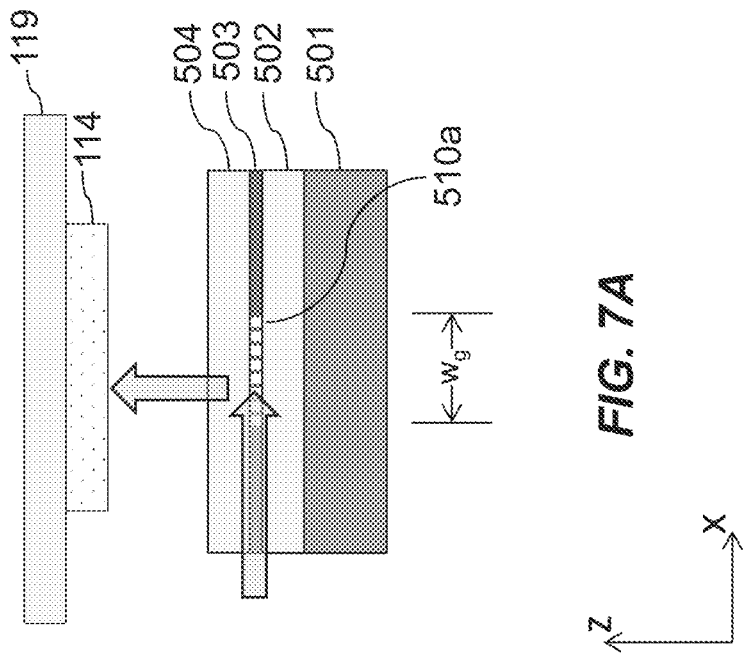

FIG. 7A illustrates an embodiment in which the microbend 505 is comprised of a grating coupler 510a. The grating coupler 510a may be a planar structure, and may be designed to efficiently couple the in-plane guided mode to a vertical direction (e.g., z-direction) to provide light to the corresponding photodiode 114. As shown in FIG. 7A, the grating coupler 510a may be cut fully through the core layer 503. For example, the grating coupler 510a may have a same height in the z-direction as the core layer 503. In some examples, the grating coupler 510a may have a width $w_g$ in the x-direction of about 10 um, and a pitch of about 300 nm, however, this may be altered based on the design. In addition, as discussed above in connection with step 420 of FIG. 4, grating coupler 510a may be formed using the same photolithography and etching process used to pattern the core layer 503 to form the cores of waveguides 182 before the second cladding layer 504 is formed.

FIG. 7B illustrates an embodiment in which the microbend 505 is a commercially-available microprism 510b. In this embodiment, optical waveguides 182 may be lithographically patterned in planar core layer 503, and a trench may be formed by a through-etch process in the core layer 503 and the first cladding layer 502, exposing a top surface of the wafer substrate 501. The microprism 510b may be placed in the trench onto a top surface of the wafer substrate 501. The width of the trench may correspond to a size of the microprism 510b. For example, the width of the trench in the x-direction may be the same as a width $w_{mp}$ in the x-direction of the microprism 510b. The matched sizing of the trench and microprism 510b may be used for guidance when placing the microprism 510b. In this example, microprism 510b may have a size of about 100 µm. The microprism may be attached to wafer substrate 501 using an adhesive.

FIG. 7C illustrates an embodiment in which the microbend 505 is a photoresist mirror 510c. In this embodiment, optical waveguides 182 may be lithographically patterned in planar core layer 503, and a trench may be formed by a through-etch process in the core layer 503 and the first cladding layer 502, exposing a top surface of the wafer substrate 501. A photoresist process may be performed to planarize the trench, and a resist microprism may be formed using grey-scale lithography. The surface of the resist microprism may form an angle of 54.7° relative to a top surface of the wafer substrate 501. After metallization of the resist microprism, a 90° reflecting mirror may then be formed on a surface of the resist microprism. For example, a metal film (e.g., aluminum) may be deposited on angled surfaces of the resist microprism.

FIG. 7D illustrates an embodiment in which the microbend 505 is a wet-etch silicon Si mirror 510d. In this embodiment, a silicon-on-quartz wafer may be provided, and the silicon may be etched to form silicon islands corresponding to a micro-bend. For example, a first etch may be performed to pattern the silicon of the silicon-on-quartz wafer to leave isolated, discrete portions of the silicon remaining on the quartz wafer at locations corresponding to the micro-bends 505. Then, a wet-etch process may be performed to form a sloped surface from the silicon at each micro-bend location. The wet etch may be performed using an etchant that has different etch rates (or etch selectivities) in dependence on the Si crystal facets. The wet etch may thus expose the Si crystal [111] facet, e to form a facet (surface) having an angle of 54.7° relative to a top surface of the wafer substrate 501. Then a metal film (e.g., gold) may be deposited on the angled surfaces to form mirrors. The remaining portions of the signal feed module 117 may then be formed, such as with respect to the cladding layers, core layer 503 and metal pattern 507. Alternatively, all or some of the wet-etched Si mirror 510d may be formed after forming optical waveguides 182. For example, after forming the Si islands, the optical waveguides 182 may be lithographically patterned and then the Si islands may be exposed and wet etched to form the oblique facet surface from the Si island on which the reflective metal of the mirror 510d is formed.

Figure 7E:
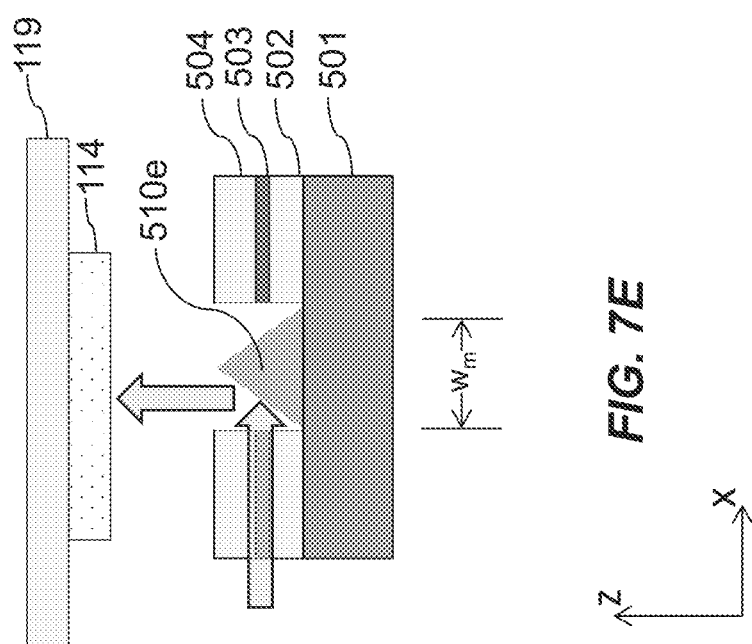

FIG. 7E illustrates an embodiment in which the microbend 505 is an epitaxially-grown micromirror 510e. In this embodiment, optical waveguides 182 may be lithographically patterned in planar core layer 503, and a trench may be formed by a through-etch process in the core layer 503 and the first cladding layer 502, exposing a top surface of the wafer substrate 501. The base structure of the micromirror 510e may be an epitaxially grown crystalline material (e.g., silicon Si). During the epitaxial growth, a faceted surface of the crystalline material may form an oblique angle on which the reflector may be formed. In some examples, a wet-etch process may be performed to form the base structure for the mirror surface on which the reflector may be formed. Then a metal film (e.g., gold) may be deposited on the angled surfaces to form mirrors.

The disclosed chip-level optical feed to the photodiode antenna array module 100 may be used to drive other types of antenna arrays, such as, for example, patch arrays. Patch arrays may include aperture-coupled patch arrays that vertically couple RF signals from coplanar waveguides to radiating patches through slots located on the ground plane.

Figures 8A, 8B:
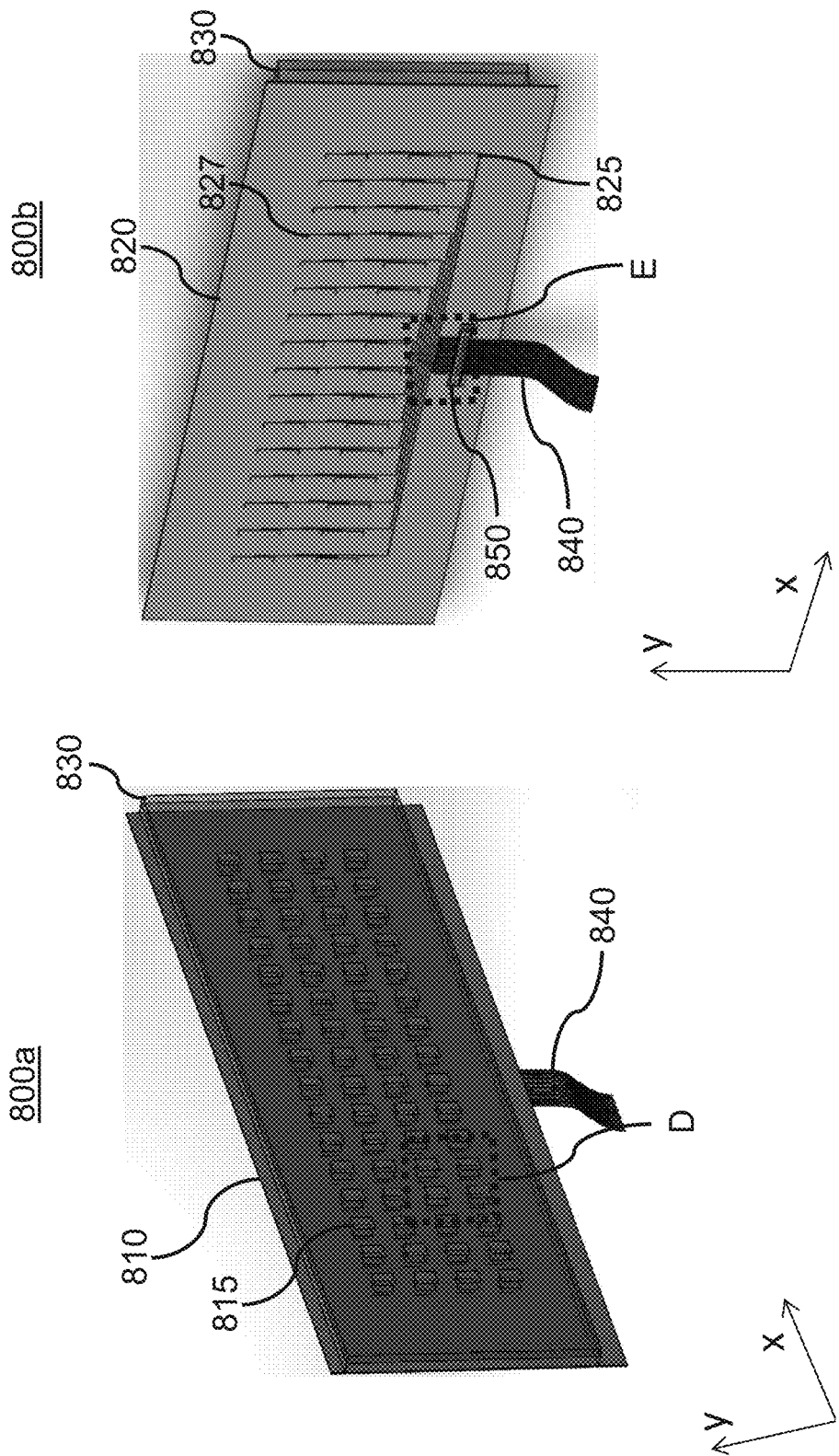
FIG. 8A is a perspective view illustrating a front side of an electrically-distributed feed module having a two-dimensional aperture coupled stacked patch array module with RF transmission lines formed in the substrate and FIG. 8B is a perspective view illustrating a back side of the electrically-distributed feed module of FIG. 8A having an optically-addressed antenna feed, according to certain exemplary embodiments.

FIG. 8A is a perspective view illustrating a front side of a two-dimensional aperture coupled stacked patch array module having RF transmission lines formed in the substrate and FIG. 8B is a perspective view illustrating a back side of the stacked patch array module of FIG. 8A having an optically-addressed antenna feed, according to certain exemplary embodiments. FIG. 8C is an enlargement of section D of FIG. 8A illustrating double-stacked patches excited through a slot on the ground plane by a feeding microstrip line, FIG. 8D is an enlargement of section E of FIG. 8B illustrating an array of photodiode-coupled RF generation and feed to RF power amplifiers through wire bonds, and FIG. 8E is an enlargement of section F of FIG. 8D illustrating wire bonds. As discussed more fully below, the embodiment of FIGS. 8A-8E provide RF transmission lines comprising patterned metal (e.g., coplanar waveguide (CPW) and microstrips) with photodiodes mounted on the edge of the transmission array module.

In the embodiments illustrated in FIGS. 8A-8E, the photodiode layout includes N photodiodes provided in a 1d array of 1×N photodiodes. The 1D photodiode array of FIGS. 8A-8E is provided at an edge of the electrically-distributed signal feed module 800, and is configured to convert input optical signals to RF signals at the edge. By contrast, in FIG. 1A, the photodiode layout includes M×N photodiodes distributed as a two-dimensional array of M×N photodiodes at locations corresponding to the antennas 110. It will be appreciated that both signal feed modules 117 and 800 receive an optical feed signal from optical fibers 840 and convert the optical feed signals to an RF signal to drive antennas 110. Alternative embodiments of signal feed modules include a distributed two-dimensional array of photodiodes 114 connected to the signal feed module (as with signal feed module 117 described herein) and RF waveguides formed by the signal feed module connecting the RF signal generated by the photodiodes 114 to one or more antennas 110 (as with signal feed module 800).

In FIGS. 8A-8C, a transmission antenna array module may include a front side 800a and back side 800b. The front side 800a may include a first substrate 810 on which is provided a patch array including a plurality of patch antennas 815 regularly arranged on the first substrate 810 in the x- and y-directions. Patch arrays may include aperture-coupled patch arrays that vertically couple RF signals from coplanar waveguides to radiating patches through slots located on the ground plane.

The back side 800b may include a second substrate 820 on which are provided a plurality of microstrip lines 825 extending from an input array module 850 to a plurality of slots 827 regularly arranged on the second substrate 820 in the x- and y-directions. The microstrip lines 825 may be metallic microstrip lines. Together with ground plane 830, each microstrip line forms a microstrip, forming an RF waveguide to transmit an RF signal generated by a photodiode 114 to a corresponding patch antenna 815 (or group of patch antennas 815). The regular arrangement of the patch antennas 815 may correspond to the regular arrangement of the slots 827. For example, if viewed from a z-direction, perpendicular to the x- and y-directions, each patch antenna 815 would be aligned with a corresponding slot 827. A ground plane 830 may be sandwiched between the first substrate 810 and the second substrate 820. For example, the first substrate 810 may be attached to a first side of the ground plane 830, and the second substrate 820 may be attached to a second side of the ground plane 830, where the first and second sides of the ground plane 830 face in opposite directions.

Each of the first substrate 810 and the second substrate 820 may be formed as a single continuous material layer, or be formed as several interconnected panels, such as to form a single printed circuit board or a group of interconnected circuit boards. Each of the first substrate 810 and the second substrate 820 may comprise an insulating layer, such as polyimide. These substrates 810, 820 (and additional insulating layers if desired) insulate patterned metal layers (e.g., microstrip lines 825 of the RF microstrips, ground plane, patch antennas, etc.) disposed on or between the insulating layers. The first and second substrates 810 and 820 need not be planar as shown in FIGS. 8A and 8B, and instead may comprise curved surfaces, such as a concave and/or convex surface. For example, the first and second substrates 810 and 820 may comprise or be formed to conform to a spherical surface or conform to a curved surface (e.g., body or wing) of an aircraft. It will be appreciated that the positioning of the patch antennas 815 are dependent on their placement on the first substrate 810 in this example, and thus may also have a non-planar configuration and may be the same non-planar configuration as described herein with respect to the first substrate 810. For ease of description, the first and second substrates 810 and 820 are illustrated as having a square or rectangular shape with four linear edges. However, the first and second substrates 810 and 820 may have other shapes. In this example, the first and second substrates are formed of polyimide, but it will be appreciated that the structure of the antenna array module of FIGS. 8A and 8B may be formed as described with respect to signal feed module 117 (including use of crystalline substrates and photolithographically patterning techniques).

Ground plane 830 may comprise a sheet metal spaced a constant spacing distance away from the first and second substrates 810 and 820. Although ground plane 830 is shown as a rectangular planar sheet, ground plane 830 may also have other geometries, including non-planar structure as described with respect to first and second substrates 810 and 820 to conform to a non-planar positioning of the patch arrays 815. While FIGS. 8A and 8B have been shown to include a ground plane 830, other exemplary implementations operate without the provision of a ground plane.

As illustrated in FIGS. 8A-8C, the microstrip lines 825 and radiating patch antennas 815 are designed on two sides of the ground plane 830, in which slots 827 are designed in the ground plane 830 for resonant coupling from the feeding microstrip lines 825 to the radiating patch antennas 815. The aperture coupling scheme enables complete isolation between the feed network and radiating elements. The microstrip lines 825 can be designed on a flexible liquid crystal polymer (LCP) substrate with a thickness of 0.101 mm and a dielectric constant of 2.9. LCP may be used for millimeter wavelength (mmW) applications due to its low loss, light weight, high water-resistivity, low cost, etcetera. Choosing a thin LCP substrate for the feed network can reduce the width of each microstrip line 825, thus suppressing the internal mutual coupling within the array feed network. The antenna patch 815 may have a size about a quarter of the wavelength at the interested frequency and may be fabricated on a thick and low dielectric high frequency material (i.e., RT/duroid 5880 substrate) for wide impedance bandwidth and higher radiation efficiency. In some embodiments, a 3D Finite Element Method (FEM) based Electromagnetic solver, Ansoft HFSS, may be employed to design and optimize the patch antennas 815 and coupling slot 827. Single patches 815 may lead to an impedance bandwidth over 25%. To further improve the impedance bandwidth, an additional patch with different size may be optimized and stacked to realize a frequency bandwidth over 50% (about 1.7:1 bandwidth). Such a wide bandwidth offers a frequency coverage from 25-42 GHz, which includes two desired 5G spectrum allocation, i.e., 28 GHz and 40 GHz.

Patch antenna 815 may have 3-dB E- and H-plane beamwidths of about ±50°, which enables wide angular steering for the phased array applications. The 2D patch phased array may be designed to enhance the gain and beam patterns. The 2D array may consist of arrayed subarrays in the horizontal direction for active beam steering. Each subarray consists of $2^N$ (N=2 or 3 dependent on the application requirement) identical patch antennas 815 with a pitch of about half of the wavelength in the elevation direction and a 1-to-$2^N$ microstrip line power splitter. N stages of 1-to-2 T-splitters with same impedance transformers can be cascaded to attain a 1-to-$2^N$ splitter. To save space in such a compact region, quarter-wavelength impedance transformers will be designed at the center frequency to convert the 50-Ω lines to 100-Ω. The use of the subarray can improve the phased array gain by a factor of $2^N$ and the beamwidth of about $100°/2^N$ in the elevation direction. In addition, to double the data throughput, a dual linear polarization array will be considered. In particular, an interleaving of the H-pol and V-pol patch subarrays will be investigated. The aperture-coupled patch array antennas can be fed with the arrayed MUTC photodiodes. To improve the transition between the arrayed photodiode array and the antenna feed network, a trench will be formed by laser cutting into the feeding substrate. This allows the arrayed photodiodes to be embedded in the trench and leveled with the feeding transmission lines to achieve a low transition loss when wire bonds are applied to the coplanar waveguides on both the photodiode packaging and antenna feed network.

Patch antennas 815 may be low-profile, conformable to planar or non-planar surfaces, simple and inexpensive to manufacture by using conventional PCB fabrication process, compatible with MMICs. In some embodiments, patch antenna 815 may be fed by microstrip lines 825. In other embodiments, patch antenna 815 may be fed by coaxial probe, aperture coupling, and proximity coupling.

As shown in FIGS. 8D and 8E, a plurality of optical fibers 840 may be connected to the array module 850 to provide input optical signals to the input array module 850. The array module 850 may convert the input optical signals to RF signals to be transmitted to the slots 827 via microstrip lines 825. For example, the RF signals output from the array module 850 may be transmitted through wire bonds 856 to power amplifiers 854, then through CPW-to-microstrip transitions 852 to microstrip lines 825. Power amplifiers 854 may be RF power amplifiers and may be provided to further boost the radiation power.

Figure 9:
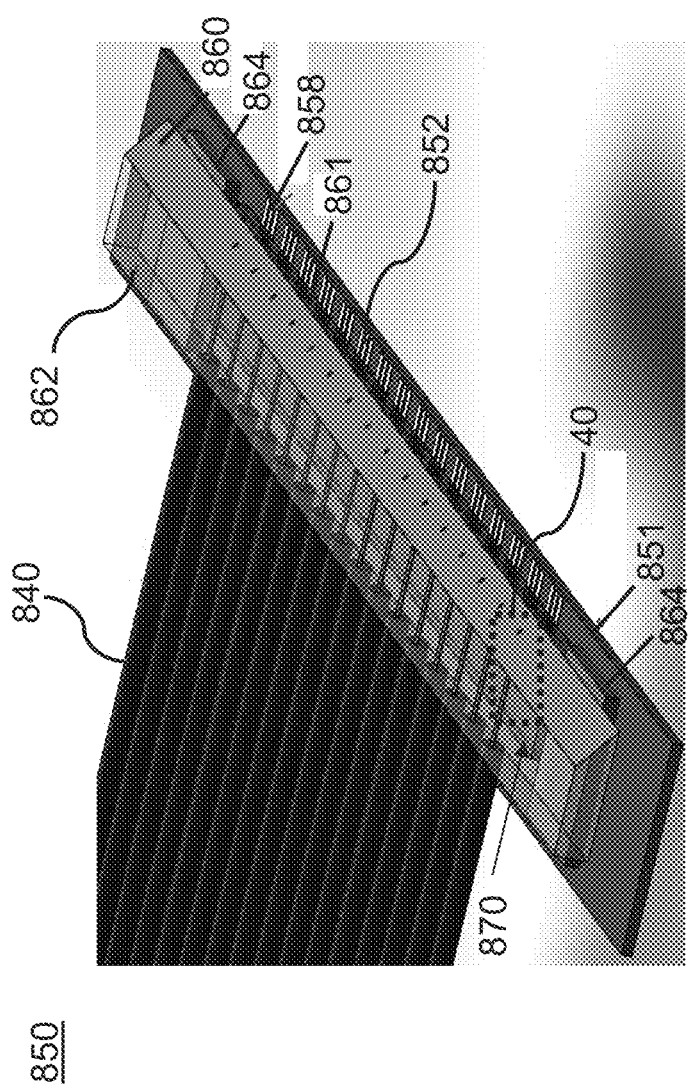
FIG. 9 is a perspective view of the array module of FIGS. 8A and 8D, according to certain exemplary embodiments.

FIG. 9 is a perspective view of the array module 850 of FIGS. 8A and 8D, according to certain exemplary embodiments. As shown in FIG. 9, an optical fiber array 840 may be connected to the array module 850 via v-groove assembly 862 forming an optical connector. The commercially available v-groove assembly 862 can be polished to include a 45° edge, which is then metalized to form an optical mirror 860. In this example, the mirror 860 forms a 90° optical bend to redirect the input optical signals received from optical fiber array 840 down to the back-illuminated MUTC photodiodes (e.g., photodiodes 114) formed on a single semiconductor chip 870 (although several discrete semiconductor photodiode chips alternatively may be used to form the MUTC photodiodes 114). The optical fibers of the optical fiber array 840 may individually terminate at a reflecting region 40 of the optical mirror 860. For example, each reflecting region 40 may be portion of the optical mirror 860 and may be configured to reflect an individual optical signal input by an individual optical fiber of the optical fiber array, such as discussed further below in connection with FIGS. 10A to 11D. Such an integration approach may lead to a low-profile packaging of photodiodes since both input optical fibers and output RF lie in the same plane. An array of photodiode mesas may be fabricated on an InP substrate 861 and then flip-chip bonded with RF electrodes (coplanar waveguides) on a substrate 851 formed of AlN or diamond. The AlN or diamond substrate 851 may provide an efficient thermal dissipation at the photodiodes when the photodiodes operate at a high optical input power. The optical fiber array 840 may be integrated with an array of photodiodes via precise optical alignment with an assistance of two spacers 864 located at both ends of the v-groove assembly 862. For example, the spacers 864 may be provided on the substrate 851 and the v-groove assembly 862 may be provided on the substrate 851.

In exemplary embodiments, traveling distance from the turning point on the optical mirror 860 to the active area of the photodiode may be tolerated to be about 150 μm when a 28 μm modified uni-traveling carrier (MUTC) photodiode (30 GHz 3-dB bandwidth) is used. In this example, an optical focusing lens becomes unnecessary, which may significantly reduce the packaging complexity, improve the yield, and reduce the cost. However, substrate thinning may be performed to the bottom facet of the v-groove assembly 862 and InP substrate 861 to ensure tight spots on the active area of the photodiodes for sufficient optical/electrical conversion.

In some embodiments, v-groove assembly 862 may be an off-the-shelf v-groove fiber array assembly. Commercially-available v-groove fiber array assemblies 862 may be inexpensive, particularly for single mode, and may provide for a variety of choices in terms of channel count, array pitch, packaging material, and angular polishing service at the end facet of the v-groove assembly. The array typically has a position accuracy of less 0.5 μm, sufficient to match with the lithographically-defined photodiode array. Up to 64 channels are available in the fiber array enables directly fabrication of a large-scale of photodiode array. The proposed arrayed photodiode package can be used many different RF photonic applications, i.e., radio-over-fiber links, and phased array antennas. In some cases, a conformal patch array may be integrated with the photodiode array to achieve a wideband operation covering a frequency range from 25 to 42 GHz.

Figure 10A:
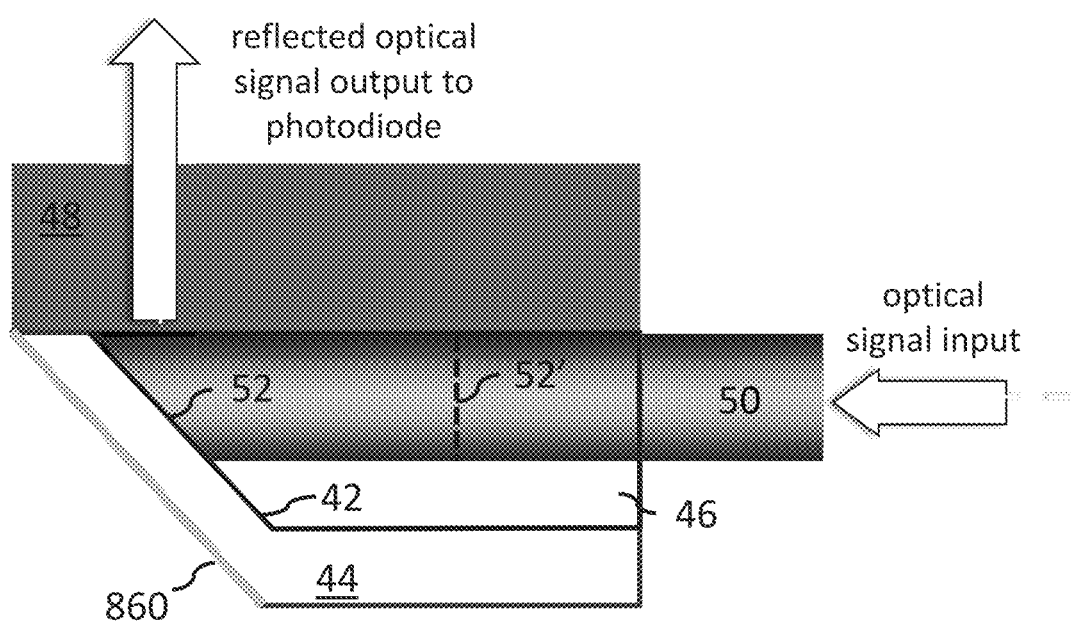
FIGS. 10A to 10E illustrate exemplary details regarding v-grooves of the v-groove assembly, according to certain exemplary embodiments.
Figure 10B:
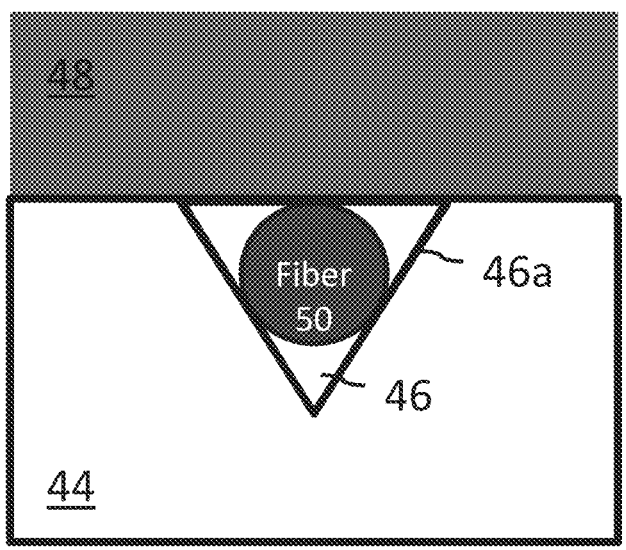
Figure 10C:
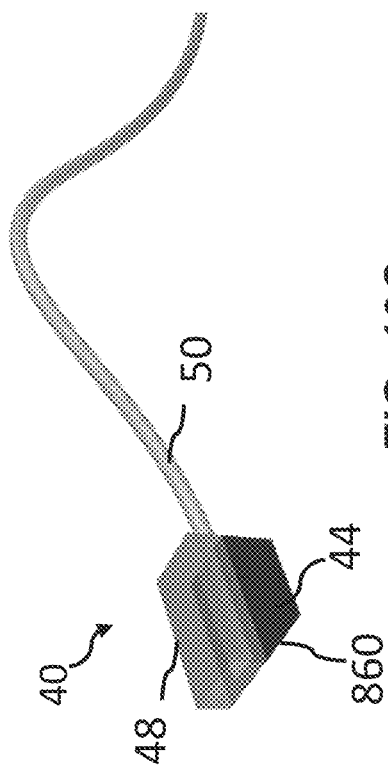
Figure 10D:
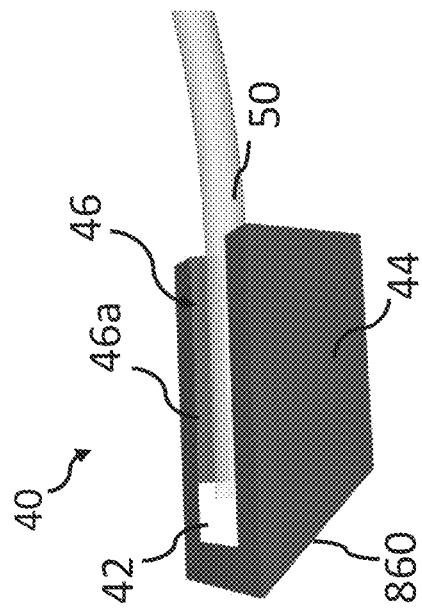

FIGS. 10A to 11D illustrate certain aspects of the v-groove assembly 862, according to the present invention. FIG. 10A is a cross sectional side view and FIG. 10B is a cross sectional front view of an exemplary reflecting region 40, which is an area of v-groove assembly 862 at which the optical fiber 50 terminates. FIGS. 10C and 11D illustrate perspective view of the exemplary reflecting region 40, with the cover 48 removed from the illustration of FIG. 10D to provide additional detail.

Referring to FIGS. 9 and 10A to 10D, the optical fiber array 840 may include a plurality of individual optical fibers, identified in FIGS. 10A-10D as optical fiber 50. Optical fiber 50 may extend parallel to the surface of substrate 851. At or within reflecting region 40, the optical fiber 50 terminates. An optical signal transmitted by optical fiber 50 is emitted from the optical fiber and reflected by reflecting surface 42. The reflecting surface 42 may be positioned at a 45° angle with respect to the surface of the substrate 851, creating a 90° bend in the optical transmission path. The reflecting surface 42 of reflecting region 40 thus redirects the optical signal emitted from the optical fiber towards the photodiode 14 through an opening in the substrate 851. In this example, the reflecting surface 42 may be the optical mirror 860 illustrated in the perspective view of FIG. 9.

Reflecting region 40 may comprise a substrate 44 and a transparent cover 48 attached to the substrate 44. The substrate may be a crystalline substrate, such as a silicon crystalline substrate or other semiconductor substrate formed from a semiconductor wafer. The following discussion may refer to the substrate 44 as a silicon substrate, but such discussion may be equally applicable to other substrates.

A plurality of v-grooves 46 may be formed in silicon substrate 44. The v-groove 46 may be etched in silicon using an anisotropic etch, such as KOH, to produce angled facets including the v-groove sidewalls and an end facet forming the reflecting surface 42. The reflecting surface 42 may be positioned at one end of the v-groove 46 within the silicon substrate 44. The v-groove 46 may terminate at a side surface of the silicon substrate 44 (forming the second end of the v-groove 46), allowing insertion of optical fiber 50. The reflecting surface 42 may be metalized for improved reflectivity, or reflection of the optical signal provided by the optical fiber 50 may occur by total internal reflection (TIR). A transparent cover 48, such as a glass cover, may be attached to the silicon substrate 44, such as with an adhesive. In some examples, the transparent cover 48 may have a concave or convex surface (e.g., the upper and/or lower surfaces of the cover 48), to focus or otherwise direct the light reflected by the reflecting surface 42.

Optical fiber 50 may be placed within v-groove 46 and may be supported by the oblique sidewalls 46a of the v-groove 46 running the length of the v-groove 46. Optical fiber 50 may terminate at surface 52 with an oblique angle substantially matching the angle of the reflecting surface 42, here a 45° angle, and surface 52 may be in contact with the reflecting surface 42. Alternatively, optical fiber 50 may terminate with a surface perpendicular to its outer cylindrical surface, such alternative terminating surface of optical fiber 50 represented by dashed line at surface 52' in FIG. 10A. The portion of the v-groove 46 that is not occupied by optical fiber 50 may be occupied by air or other gas. Alternatively, the portion of the v-groove 46 may be filled with a material having an index of refraction that substantially the same as the index of refraction of the material the optical fiber 50 (the same as or within the range of the index of refraction of the core of the optical fiber and the cladding of the optical fiber 50) and/or matches the index of refraction of the cover 48. For example, when the optical fiber 50 terminates at an oblique angle surface 52 to conform with reflecting surface 42, the v-groove 46 may be filled with the same material as the cladding of the optical fiber 50 (or having an index of refraction substantially the same as the cladding of the optical fiber 50), such as 1.444. When the optical fiber 50 terminates at a perpendicular surface 52', the v-groove 46 may be filled with the same material as the core of the optical fiber 50 (or a material having an index of refraction substantially the same as the core of the optical fiber, such as about 1.4475). For example, when the v-groove 46 terminates with oblique surface 52 or perpendicular surface 52' and the cover 48 is a glass cover, the v-groove 46 may be filled with the same glass material as the glass cover 48.

Figure 10E:
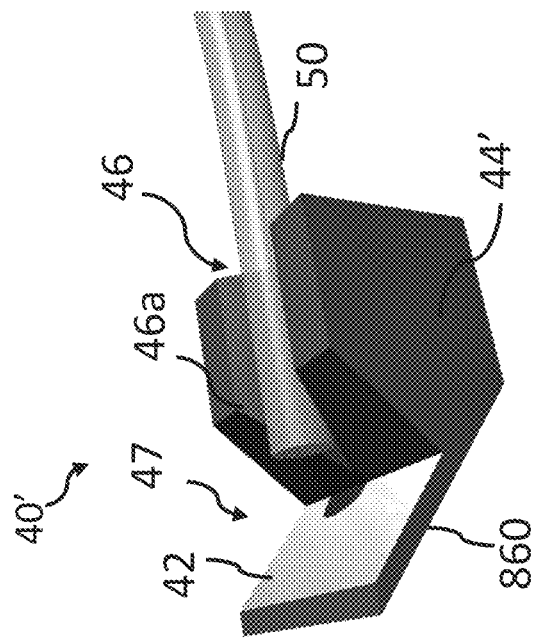

FIG. 10E illustrates an alternative substrate 44' that may be used in place of the substrate 44 described above. The substrate 44' may be the same as substrate 44 except that an additional v-groove 47 may be formed to extend in a perpendicular direction to the extending direction of v-groove 46 second v-groove 47 may extend in a direction perpendicular to the axis of the optical fiber having one oblique surface forming reflecting surface 42 and a second oblique surface opposite to the reflecting surface 42 where first v-groove 46 terminates. One or both of first v-groove 46 and second v-groove 47 may be obtained by sawing the silicon substrate 44'. The saw may also act to polish the surfaces forming the second v-groove 47 while cutting the second v-groove 47. When cutting second v-groove 47, dicing saw should have a blade geometry and blade position to produce a reflective facet at about 45° with respect to the axis of optical fiber 50 (or with respect to the axis of groove 46 that will align with the axis of the optical fiber 50). Although optical fiber 50 is shown to terminate with a perpendicular surface (corresponding to surface 52' in FIG. 10A), it will be appreciated that the substrate 44' may be implemented with all the various features and alternatives described above, including use of an oblique terminating surface 52 of optical fiber 50 and various index matching material options for filling remainder of grooves 46 and 47 not occupied by optical fiber 50.

Figure 11A:
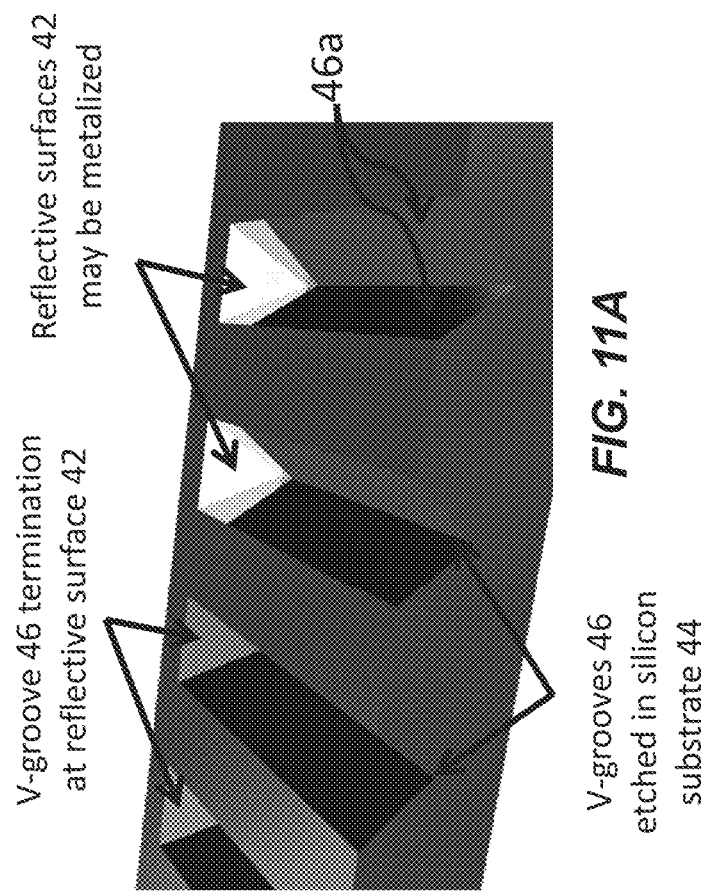
FIGS. 11A to 11C illustrate an exemplary method of manufacturing and further details of the v-grooves, according to certain exemplary embodiments.
Figure 11C:
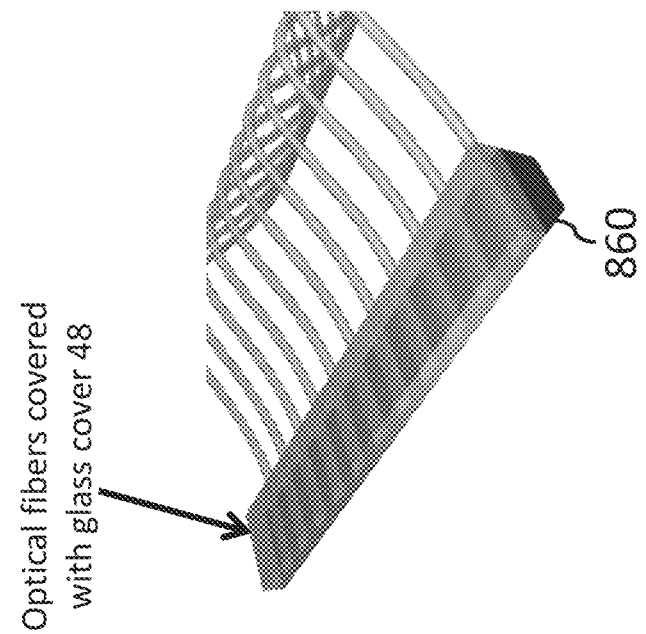
Figure 11B:
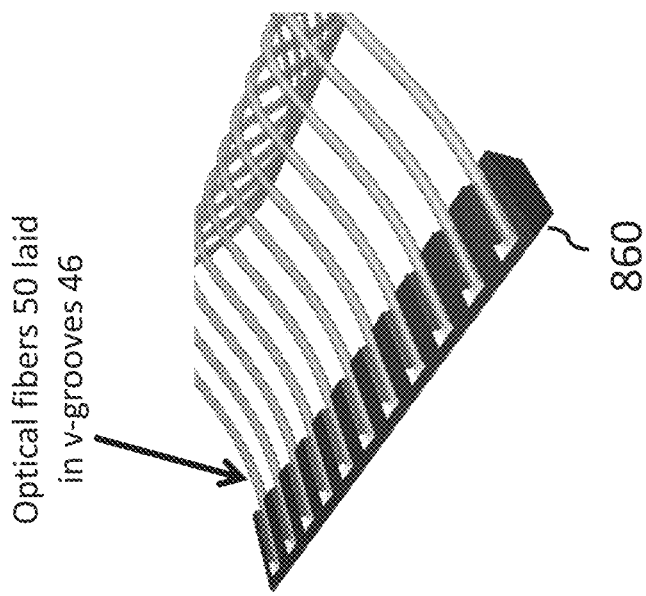

FIGS. 11A to 11C illustrate an exemplary method of manufacturing and further details of the reflecting regions 40 prior to assembly with the array module 850. FIG. 11A illustrates a crystalline substrate 44 having a plurality of v-grooves 46 formed therein. The v-grooves 46 may be formed by anisotropically etching the crystalline substrate 44. For example, a crystalline silicon wafer with a silicon <100> upper surface may be selectively etched with KOH by forming mask on the <100> surface of the silicon wafer with openings corresponding to the openings of v-grooves 46. As etching of the crystalline planes of the silicon substrate are etched at different rates via KOH, sidewalls 46a of the v-grooves 46 are formed by <111> surfaces of the silicon substrate 44. The end of each v-groove 46 is similarly formed to provide reflecting surface 42.

In some examples, the reflecting surface 42 may not be formed at a 45° angle with respect to the axis of the v-groove 46 to which it faces. For example, the surface angle may be formed at 54.7° due to the crystal facets of crystalline silicon. Thus, the resulting optical signal reflected by reflecting surface 42 may not form a 90° angle with respect to the input optical signal incident on the reflecting surface 42. In this instance, the optical signal output by the reflecting surface 42 may be made perpendicular to the surface of the substrate 851 as desired. As discussed with respect to FIG. 10E, a second v-groove 47 may be formed at this time (not shown in FIGS. 11A-11C) by sawing the silicon substrate 44 in a direction perpendicular to the axis of the first v-grooves 46 where the saw blade and/or saw blade angle with respect to the silicon substrate 44, to replace the facet initially forming the end of each v-groove 46 with reflecting surface 42 having the desired 45° angle. Alternatively, the glass cover 48 attached to the silicon substrate 44 may form a prism, so that the top and bottom surfaces of the glass cover are not parallel to each other but form an angle. In this alternative, the reflecting surface 42 may remain at an angle that is not 45° (e.g., between 60° and 30°). The optical signal then exits the reflector at an angle with respect to the upper surface of the glass cover 48 (formed as a prism) which then acts to bend the optical signal to a 90° angle with respect to the axis of the v-groove 46 of the reflecting region 40. In another alternative, the optical signal output by the reflecting region 40 may be left unmodified and output with an angle other than 90°, while the mounting surface of the reflecting region 40 (which may be the top or bottom surface as shown in the figures) may be made stepped or angled to rotate the structure of the reflecting region 40 to obtain an output optical signal that is 90° with respect to the surface to which it is mounted (e.g., 90° with respect to substrate 851).

Reflecting surface 42 may optionally be coated with a film reflective metal, such as Al, Au or Ag. The metallization may result in a film of constant thickness that is conformally formed on the reflecting surfaces 42. For purposes of description, only two reflecting surfaces 42 are shown in FIG. 11A as being coated with a reflective metal, however, all or none of the reflective surfaces 42 cut into the silicon wafer may be metalized. To minimize processing steps, the entire v-groove 46 may be coated with a reflecting metal (not shown), or only the reflecting surface 42 maybe coated by removing the v-groove formation mask, and forming a second mask patterned to expose the reflecting surfaces 42 (e.g., via a strip opening in the second mask extending over all of the reflecting surfaces 42 of the v-grooves 46). The deposition of the reflecting metal may be performed by conventional semiconductor manufacturing techniques, such as CVD or electroplating. The silicon substrate may then be subjected to an initial cutting process separate groups of v-grooves 46, with each group of v-grooves 46 arranged in a row (as shown in FIGS. 11A-11C) or arranged in two rows (not shown—where the structure of silicon substrate 44 of FIG. 11B is duplicated and integral with two rows of v-groove openings on opposite side surfaces of the silicon substrate 44, rather than a single row of v-groove openings on a single side surface of silicon substrate 44 as shown in FIG. 11B).

An optical fiber 50 is then placed in each of the v-grooves 46 (FIG. 11B). The optical fibers 50 each may have the structure described herein, such as an oblique surface 52 or a perpendicular surface 52' forming the end of the optical fiber 50 (see FIG. 10A and related description). Transparent glass cover 48 may then be attached to the top surface of the silicon substrate 44 with an adhesive.

Optionally, before or after attaching transparent glass cover 48, gaps in the v-grooves 46 not occupied by the optical fibers 50 may be filled, such as with a dielectric constant matching material (e.g., similar to the optical fiber 50 (inner core or outer cladding) and/or glass cover 48). For example, prior to attaching the transparent glass cover 48, the v-groove filling material may be deposited over the entire surface of the substrate 44 and within the v-grooves 46 and then planarizing the resultant structure so that upper surfaces of the v-groove filling material are coplanar with the upper surface of the silicon substrate 44. It is possible that even though the v-groove is filled with the v-groove filling material, some of the v-groove filling material may be blocked by the optical fiber 50 from filling the lowermost portions of the v-groove 46 and a gap may remain at such locations. Transparent glass cover 48 may then be attached to the top surface of the silicon substrate 44 with an adhesive. Alternatively, the glass cover 48 may not be necessary. As another example, the glass cover may first be attached to the silicon substrate 44 prior to adding the v-groove filling material. A molding injection process may be used to then add the v-groove filling material into the remaining voids within the v-grooves 46.

Figure 12:
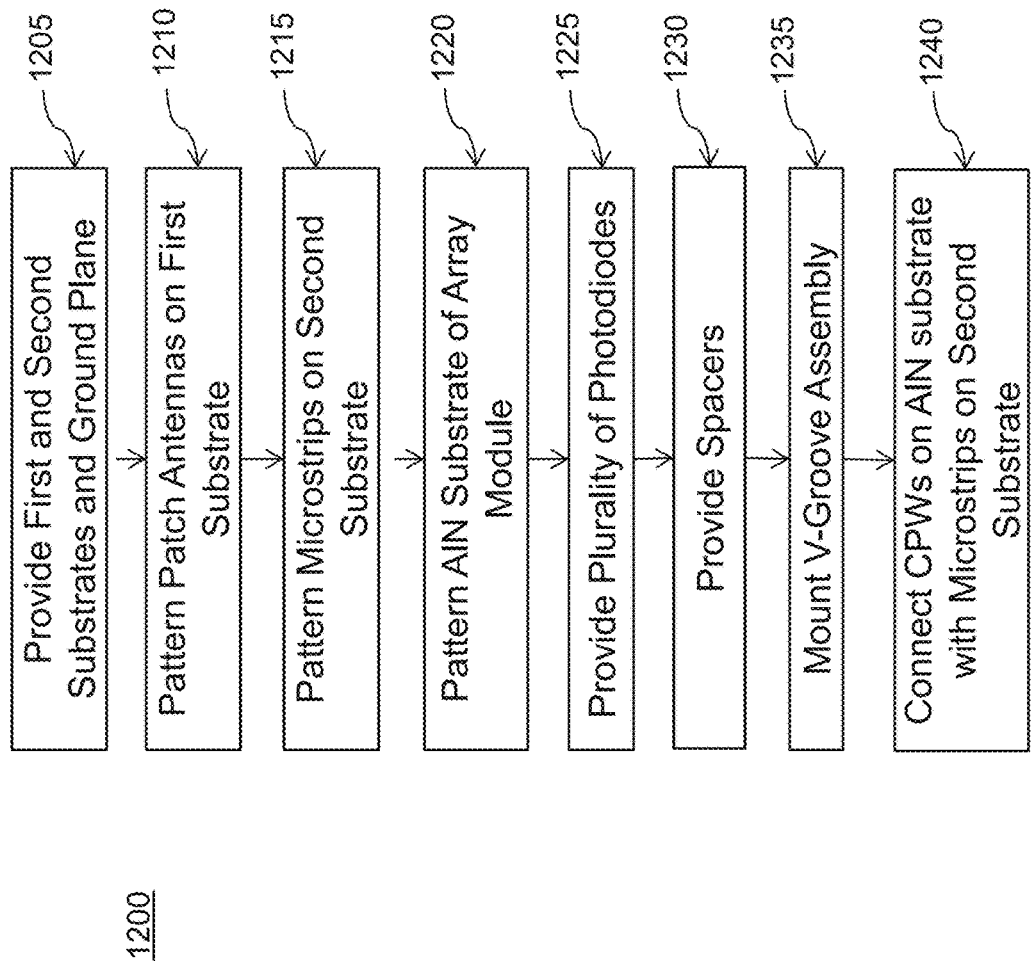
FIG. 12 is a flowchart of a method of forming an electrically-distributed feed module, according to certain exemplary embodiments.

FIG. 12 is a flowchart 1200 of a method of forming an electrically distributed feed module, according to certain exemplary embodiments.

Referring to FIGS. 12 and 8A-8B, first and second substrates 810 and 820 and ground plane 830 may be provided (step 1205). As discussed above, each of the first and second substrates 810 and 820 may be printed circuit board (PCB) substrates, such as, for example, LCP substrates. Ground plane 830 may be a metal sheet having slots 827 corresponding to the locations of the patch arrays 815.

The first substrate 810 may be patterned to form patch antennas 815 (step 1210). The patterning of the first substrate 810 may be performed on the external surface (e.g., the surface of the first substrate 810 that faces away from the second substrate 820) using a metal. As discussed above, the patch antennas 815 may be coupled to a corresponding microstrip line 825 through a corresponding slot 827 in the ground plane 830.

The second substrate 820 may be patterned to form microstrip lines 825 (step 1215) (forming corresponding microstrips along with ground plane 830). The patterning of the second substrate 820 may be performed on the external surface (e.g., the surface of the second substrate 820 that faces away from the first substrate 810) using a metal. In some embodiments, when the second substrate 820 is patterns, coplanar waveguides (CPW) coupled to microstrip lines 825. As used here, the term "microstrip" refers to a microstrip line 825, the ground plane 830, and the dielectric interposed therebetween. Once both the first and second substrates 810 and 820 have been patterned, the first substrate 810 may be attached to a first side of the ground plane 830, and the second substrate 820 may be attached to a second side of the ground plane 830. For example, the first substrate 810 may be bonded to the ground plane 830 so that each patch antenna 815 of the first substrate 810 is aligned with a corresponding slot 827 of the ground plane 830, and the second substrate 820 may be bonded to the ground plane 830 so that each microstrip line 825 terminates at a corresponding slot 827.

Next, a substrate 851 of an array module 850 may be patterned (step 1220). For example, the substrate 851 may be patterned to provide the CPW-to-microstrip transition 852.

Then a plurality of photodiodes of semiconductor chip 870 may be provided for the array module 850 (step 1225). In some embodiments, the plurality of photodiodes may be provided as an integral 1×N array of N photodiodes (i.e., plural PDs formed as a single chip). In other embodiments, the plurality of N photodiodes may be formed in 2 to N individual chips, and the N chips may be flip-chip bonded to the CPW formed on the substrate 851.

Two spacers 864 may be provided on either end of the 1×N array of N photodiodes (step 1230). The spacers 864 may provide a vertical spacing between the photodiodes and the v-groove assembly 862 placed on top of it to allow the light beam output by each optical channel of the optical fibers 840 to expand over the active area of the photodiodes (and not be concentrated in a small portion of the active area of the photodiode).

A v-groove assembly 862 may be mounted on the spacers 864 (step 1235). The v-groove assembly 862 may be formed of a plurality of lithographically etched grooves, having a "V" shape, with individual ones of the optical fibers 840 placed in each v-groove, as discussed in connection with FIGS. 11A-11C. On the side of the v-groove assembly 862 opposite to the input optical fibers 840 (e.g., the side near the amplifiers 854), the v-groove may be cut at a 45° angle, polished and coated with a reflective metal. In this example, the v-groove assembly 862 is positioned so that groove side faces downward to substrate 851. For example, referring to FIG. 11C, the glass cover 48 may be provided above the substrate 851, and the v-grooves 46 may face downward to the glass cover 48 and the substrate 851.

Finally, the CPWs on the substrate 851 may be connected to corresponding CPWs on the second substrate (step 1240). The CPWs may be connected via wire bonds, such as wire bonds 856 of FIG. 8E.

Also, though the above steps are described in a particular order, they need not occur in that order necessarily. As one example, the patterning of the first and second substrates 810 and 820 may be performed in the reverse order. For example, the second substrate 820 may be patterned before the first substrate 810.

It will be apparent to those of ordinary skill in the art that the concepts described herein are not limited to the above exemplary implementations and the appended drawings and various changes in form and details may be made therein without departing from the spirit and scope of the following claims.

What is claimed is:

1. A method of manufacturing an optical waveguide module, comprising:
   providing a wafer substrate;
   depositing a first cladding layer on the wafer substrate;
   depositing a core layer on the first cladding layer;
   photolithographically patterning the core layer to provide a plurality of optical waveguide cores;
   depositing a second cladding layer on the core layer to cover the plurality of optical waveguide cores to provide a plurality of optical waveguides;
   patterning a plurality of openings, each opening of the plurality of openings extending into each of the first cladding layer, the core layer, and the second cladding layer;
   forming a plurality of antennas on the second cladding layer, each antenna of the plurality of antennas located near a termination of a corresponding optical waveguide of the plurality of optical waveguides; and providing a plurality of photodiodes on the second cladding layer, each photodiode of the plurality of photodiodes connected to a corresponding antenna, wherein each of the plurality of openings is provided at a location corresponding to one of the plurality of photodiodes.

2. The method of claim 1, further comprising:
integrating an input fiber array with the plurality of optical waveguides.

3. The method of claim 1, wherein the wafer substrate is a quartz substrate.

4. The method of claim 1, wherein the first cladding layer includes a silicon oxide.

5. The method of claim 1, wherein the first cladding layer has a thickness less than 5 µm.

6. The method of claim 1, wherein the core layer includes a silicon nitride.

7. The method of claim 1, wherein the core layer has a thickness less than 0.4 µm.

8. The method of claim 1, wherein the second cladding layer includes a silicon oxide.

9. The method of claim 1, wherein the second cladding layer has a thickness of less than 6 µm.

10. The method of claim 1, further comprising:
providing a plurality of micro-bends, each micro-bend being provided in a corresponding one of the plurality of openings, wherein each of the plurality of openings is provided at a location corresponding to one of the plurality of photodiodes.

11. The method of claim 10, wherein the micro-bend is a microprism.

12. The method of claim 10, wherein the micro-bend is a photoresist mirror.

13. The method of claim 10, wherein the micro-bend is wet-etch silicon Si mirror.

14. The method of claim 10, wherein the micro-bend is an epitaxially-grown microprism.

15. A method of manufacturing an optical waveguide module, comprising:
providing a wafer substrate;
depositing a first cladding layer on the wafer substrate;
depositing a core layer on the first cladding layer;
depositing a second cladding layer on the core layer;
patterning a plurality of openings in a stack consisting of the first cladding layer, the core layer, and the second cladding layer, each of the plurality of openings exposing a top surface of the wafer substrate;
providing a plurality of micro-bends, each micro-bend provided in a corresponding one of the plurality of openings;
forming a plurality of antennas on the second cladding layer, each antenna of the plurality of antennas located near a corresponding one of the plurality of micro-bends; and
providing a plurality of photodiodes on the second cladding layer, each photodiode of the plurality of photodiodes connected to a corresponding antenna and located above the corresponding micro-bend.

16. The method of claim 15, further comprising:
photolithographically patterning the core layer to provide a plurality of optical waveguides.

17. The method of claim 16, further comprising:
integrating an input fiber array with the plurality of optical waveguides.

18. The method of claim 15, wherein the plurality of micro-bends include wet-etch silicon Si mirrors.

19. The method of claim 15, wherein the wafer substrate is a quartz substrate.

20. The method of claim 15, wherein the first cladding layer includes a silicon oxide.

21. The method of claim 15, wherein the first cladding layer has a thickness less than 5 µm.

22. The method of claim 15, wherein the core layer includes a silicon nitride and has a thickness less than 0.4 µm.

23. The method of claim 15, wherein the second cladding layer includes a silicon oxide and has a thickness less than 6 µm.

24. The method of claim 15, wherein the micro-bend includes at least one of a microprism, a photoresist mirror, and an epitaxially-grown microprism.

25. A method of manufacturing an optical waveguide module, comprising:
providing a wafer substrate;
depositing a first cladding layer on the wafer substrate;
depositing a core layer on the first cladding layer;
photolithographically patterning the core layer to provide a plurality of optical waveguide cores;
depositing a second cladding layer on the core layer to cover the plurality of optical waveguide cores to provide a plurality of optical waveguides;
forming a plurality of antennas on the second cladding layer, each antenna of the plurality of antennas located near a termination of a corresponding optical waveguide of the plurality of optical waveguides; and
providing a plurality of photodiodes on the second cladding layer, each photodiode of the plurality of photodiodes connected to a corresponding antenna,
wherein the photolithographically patterning the core layer includes:
providing a plurality of grating couplings,
wherein each grating coupling of the plurality of grating couplings is provided at a location corresponding to a corresponding one of the plurality of photodiodes, and
wherein each grating coupling of the plurality of grating couplings is cut fully through the core layer such that a height of the grating coupling in a vertical direction is the same as a height of the core layer in the vertical direction, the vertical direction being a direction perpendicular to a top surface of the wafer substrate.

26. The method of claim 25, further comprising:
integrating an input fiber array with the plurality of optical waveguides.

27. The method of claim 25,
wherein the wafer substrate is a quartz substrate,
wherein the first cladding layer includes a silicon oxide and has a thickness less than 5 µm,
wherein the core layer includes a silicon nitride and has a thickness less than 0.4 µm, and
wherein the second cladding layer includes a silicon oxide, and has a thickness of less than 6 µm.

28. The method of claim 25,
wherein each of the plurality of grating couplings includes gratings and spaces between the gratings, and
wherein heights of the gratings and spaces in the vertical direction is the same as the height of the core layer in the vertical direction.

* * * * *